US009087936B2

(12) United States Patent
Sun et al.

(10) Patent No.: US 9,087,936 B2
(45) Date of Patent: Jul. 21, 2015

(54) SEMICONDUCTOR PHOTOMULTIPLIER DEVICE

(71) Applicant: Agency for Science, Technology and Research, Singapore (SG)

(72) Inventors: Fei Sun, Singapore (SG); Ning Duan, Singapore (SG); Guo-Qiang Patrick Lo, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 18 days.

(21) Appl. No.: 13/760,235

(22) Filed: Feb. 6, 2013

(65) Prior Publication Data

US 2013/0200477 A1 Aug. 8, 2013

(30) Foreign Application Priority Data

Feb. 6, 2012 (SG) ................................ 201200836-3

(51) Int. Cl.
*H01L 29/49* (2006.01)
*H01L 31/0224* (2006.01)
*H01L 31/107* (2006.01)
*H01L 27/146* (2006.01)

(52) U.S. Cl.
CPC .. *H01L 31/022408* (2013.01); *H01L 27/14658* (2013.01); *H01L 31/022416* (2013.01); *H01L 31/107* (2013.01)

(58) Field of Classification Search
CPC ................ H01L 31/107; H01L 31/022416; H01L 27/14658

USPC ............................ 257/432, 438, 446, E31.063
See application file for complete search history.

(56) References Cited

U.S. PATENT DOCUMENTS

| 7,667,400 | B1 | 2/2010 | Goushcha | |
|---|---|---|---|---|
| 8,778,721 | B2 * | 7/2014 | Sanfilippo et al. | 438/73 |
| 2009/0184384 | A1 * | 7/2009 | Sanfilippo et al. | 257/432 |

FOREIGN PATENT DOCUMENTS

EP 2355155 A2 10/2011

OTHER PUBLICATIONS

D. Renker, "Geiger-mode avalanche photodiodes, history, properties and problems," Nuclear Instruments and Methods in Physics Research A, vol. 567, pp. 48-56, 2006.
W.J. Kindt, N.H. Shahrjerdy, H.W. van Zeijl, "A silicon avalanche photodiode for single optical photon counting in the Geiger mode," Sensors and Actuators A, vol. 60, pp. 98-102, 1997.
V.D. Kovaltchouk, G.J. Lobos, Z. Papandreou, K. Wolbaum, "Comparison of a silicon photomultiplier to a traditional vacuum photomultiplier," Nuclear Instruments and Methods in Physics Research A, vol. 538, pp. 408-415, 2005.

(Continued)

*Primary Examiner* — Michael Shingleton
(74) *Attorney, Agent, or Firm* — Winstead, P.C.

(57) ABSTRACT

According to embodiments of the present invention, a semiconductor photomultiplier device is provided. The semiconductor photomultiplier device includes a substrate having a front side and a back side, a common electrode of a first conductivity type adjacent to the back side, and a cell including an active region of a second conductivity type adjacent to the front side, and a contact region of the second conductivity type adjacent to the front side, the contact region being spaced apart from the active region by a separation region.

21 Claims, 15 Drawing Sheets

(56) References Cited

OTHER PUBLICATIONS

P. Buzhan, B. Dolgoshein, L. Filatov, A. Ilyin, V. Kantzerov, V. Kaplin, A. Karakash, F. Kayumov, S. Klemin, E. Popova, S. Smirnov, "Silicon photomultiplier and its possible applications," Nuclear Instruments and Methods in Physics Research A, vol. 504, pp. 48-52, 2003.

Jelena Ninkovic, Rouven Eckhart, Robert Hartmann, Peter Holl, Christian Koitsch, Gerhard Lutz, Christine Merck, Razmik Mirzoyan, Hans-Gunther Moser, Adam-Nepomuk Otte, Rainer Richter, Gerhard Schaller, Florian Schopper, Heike Soltau, Masahiro Teshima, George Valceanu, "The avalanche drift diode—A back illumination drift silicon photomultiplier," Nuclear Instruments and Methods in Physics Research A, vol. 580, pp. 1013-1015, 2007.

Koei Yamamoto, Kazuhisa Yamamura, Kenichi Sato, Shogo Kamakura, Tsuyoshi Ota, Hiroki Suzuki, "Newly Developed Semiconductor Detectors by Hamamatsu," International Workshop on Photo-detectors (PD07), Jun. 27-29, 2007, Kobe University, Japan.

Jelena Ninkovic, Ladislav Andricek, Gerhard Liemann, Gerhard Lutz, Hans-Gunther Moser, Rainer Richter, Florian Schopper, "SiMPl—An avalanche diode array with bulk integrated quench resistors for single photon detection," Nuclear Instruments and Methods in Physics Research A, vol. 617, pp. 407-410, 2010.

\* cited by examiner

US 9,087,936 B2

SEMICONDUCTOR PHOTOMULTIPLIER DEVICE

CROSS-REFERENCE TO RELATED APPLICATION

This application claims the benefit of priority of Singapore patent application No. 201200836-3, filed 6 Feb. 2012, the content of it being hereby incorporated by reference in its entirety for all purposes.

TECHNICAL FIELD

Various embodiments relate to a semiconductor photomultiplier device, for example a silicon (Si) photomultiplier with lateral bulk-Si quenching resistors.

BACKGROUND

Single photon detection has become possible since the invention of photomultiplier tubes (PMTs), which has found many applications in many different areas from then on. However, PMTs have two main handicaps: their high sensitivity to magnetic fields and their high prices.

Silicon photomultipliers (SiPMs) have been developed during recent years as a possible alternative to PMTs. Nowadays, the performances of SiPMs are fast approaching those of conventional PMTs. In addition, SiPMs have a lot of advantages over PMTs, such as compactness, low bias voltage operation, magnetic field insensitivity and fast timing response. The SiPMs can also take advantage of the highly developed silicon (Si) process technologies and the modern fabrication facilities for batch-processing in semiconductor industry, which guarantees the robustness and low fabrication costs of the devices. As a result of the excellent properties associated with SiPMs, SiPMs have found widespread applications in high-energy physics, fluorescence and luminescence decay measurements, single-molecule detection, laser ranging, nuclear medical imaging such as Positron Emission Tomography (PET), radiation detection for homeland security systems, and so on. The detection of photons in visible and ultraviolet regions is of special interest in recent years.

SiPMs have been investigated and developed for many years, and many ideas and technologies have been adopted to increase the fill factors of SiPMs. However, there remains challenges associated with conventional SiPMs, for example in terms of the dark current/dark count rate and/or the photon detection efficiency (PDE). For example, conventional SiPMs have high dark current, high crosstalk, and low fill factor (FF).

Furthermore, relatively complicated fabrication processes may be required to fabricate conventional SiPM devices, consequently resulting in a decrease in the yield and an increase in the fabrication cost. For some conventional SiPM devices, advanced wafer bonding or epitaxial technologies will be needed to realize the thick epitaxial layers. There are also issues of poor reproducibility of the conventional SiPM devices.

In addition, conventional SiPM devices may use polysilicon (poly-Si) resistors to realize current quenching. The related fabrication processes, such as deposition, doping, etching and contacting of poly-Si, will decrease the reproducibility of resistors, limit the yield, and result in increased fabrication cost. More importantly, the poly-Si strips need to be designed to be wide and long enough to guarantee the stability and reproducibility of the resistor, which accordingly reduce the fill factor of the device.

SUMMARY

According to an embodiment, a semiconductor photomultiplier device is provided. The semiconductor photomultiplier device may include a substrate having a front side and a back side, a common electrode of a first conductivity type adjacent to the back side, a cell including an active region of a second conductivity type adjacent to the front side, and a contact region of the second conductivity type adjacent to the front side, the contact region being spaced apart from the active region by a separation region.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
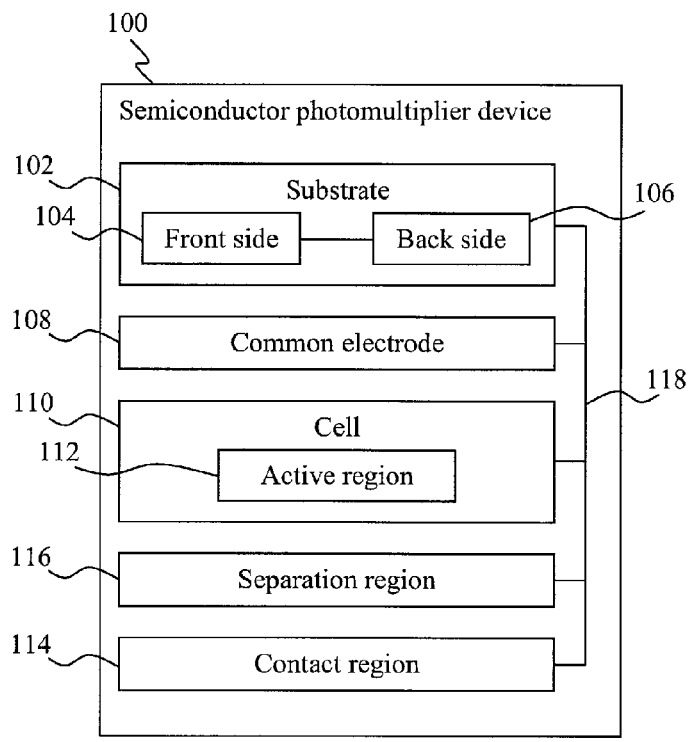
FIG. 1A shows a schematic block diagram of a semiconductor photomultiplier device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

Various embodiments may provide a silicon photomultiplier (SiPM) structure with high or increased photon detection efficiency (PDE). Various embodiments may also provide an approach to increase the fill factor, the photon detection efficiency (PDE) and the quantum efficiency in silicon photomultipliers. As a result, a high or improved PDE may be expected or obtained, without sacrifices of other performances.

Various embodiments may provide a silicon photomultiplier (SiPM) structure with increased fill factor and/or with increased quantum efficiency (QE) at short wavelengths and/or without poly-Si related processes. Various embodiments of the SiPM device may provide a lateral bulk-silicon (Si) quenching resistor to replace a poly-Si resistor, and/or elimination of structured metal wires on the active region, and/or separation of the active region and the contact region.

Various embodiments may provide packaging of device modules, as well as readout circuits for the SiPM devices of various embodiments.

The fabrication process for forming the SiPM devices of various embodiments may be easier and may result in a higher yield, as compared to the process for forming conventional SiPM devices. In addition, the fabrication process may be free of polysilicon (poly-Si) related processes.

The SiPM devices of various embodiments may provide one or more of the following: front side illumination, low dark current, high fill factor, bulk-Si quenching resistor (e.g. lateral bulk-Si quenching resistor), or no contact holes in the active region. The approach of various embodiments may provide ease of fabrication of the SiPM devices.

The SiPM of various embodiments may for example be used in applications related to medical imaging, including nuclear medical imaging (for example Positron emission tomography (PET)), biophotonics, high-energy physics, laser ranging and radiation detection, for example for homeland security systems. The SiPM of various embodiments may be employed for healthcare applications, where the SiPM device may be magnetic resonance (MR)-compatible, and may be developed for hybrid MR/PET instrumentation.

The silicon photomultiplier (SiPM) operating mechanism will now be described. Avalanche Photo Diode (APD) is the basic building block of SiPM. When light is launched to an APD, the photons may be absorbed by the material of the APD, which consequently results in the generation of electron/hole pairs. The generated free carriers (electrons and holes) may then be accelerated by a high electric field in the device to acquire a speed high enough to trigger the avalanche process. In this avalanche process, more and more carriers may be generated through impact ionization. All the carriers may finally contribute to the current flowing through the diode. Therefore, an abrupt increase may be observed in the current-voltage (I-V) curve of an APD when avalanche occurs, where the corresponding voltage associated with the avalanche process is called the breakdown voltage. The breakdown voltage means the voltage beyond which the avalanche process occurs.

SiPM is also called Geiger-mode APD, because its operating voltage is normally 10%-20% higher than the breakdown voltage, in order to achieve high detection sensitivity. In this working condition, a resistor in series with the APD may be quite necessary to control the current and the corresponding power consumption of the diode. Furthermore, the resistor may also be used to quench the fired diode. For example, when the diode is fired by a single photon, obvious current increase may be observed, which results in a bias increase on the resistor. Accordingly, the voltage that is applied on the diode itself may be lowered below the breakdown voltage. The avalanche process is consequently turned off until the diode is fired again by another photon.

The APD diode and the quenching resistor form one cell of the SiPM device. By parallel connection of large numbers of cells, each of which works in Geiger-mode, the intensity of the incident light on the SiPM device may be measured according to the analogue sum of the currents from each cell. The photon detection efficiency (PDE) of a SiPM may be given by the product of three parameters: the quantum efficiency (QE), the avalanche triggering probability ($P_{trigger}$), and the fill factor (FF). The PDE may be determined using Equation 1 below, $$PDE = QE \times FF \times P_{trigger} \quad \text{(Equation 1)}.$$

FIG. 1A shows a schematic block diagram of a semiconductor photomultiplier device 100, according to various embodiments. The semiconductor photomultiplier device 100 includes a substrate 102 having a front side 104 and a back side 106, a common electrode 108 of a first conductivity type adjacent to the back side 106, a cell 110 including an active region 112 of a second conductivity type adjacent to the front side 104, and a contact region 114 of the second conductivity type adjacent to the front side 104, the contact region 114 being spaced apart from the active region 112 by a separation region 116. In FIG. 1, the line represented as 118 is illustrated to show the relationship between the substrate 102, the common electrode 108, the cell 110 with the active region 112, the contact region 114 and the separation region 116, which may include electrical coupling and/or mechanical coupling.

In other words, separate active region 112 and contact region 114 may be provided in the semiconductor photomultiplier device 100, where a gap or separation region 116 may be provided in between the active region 112 and the contact region 114. The active region 112 and the contact region 114 may be arranged laterally relative to each other, adjacent to the front side 104. The front side 104 and the back side 106 are opposite sides of the substrate 102. The second conductivity type may be different from the first conductivity type.

Figure 1B:
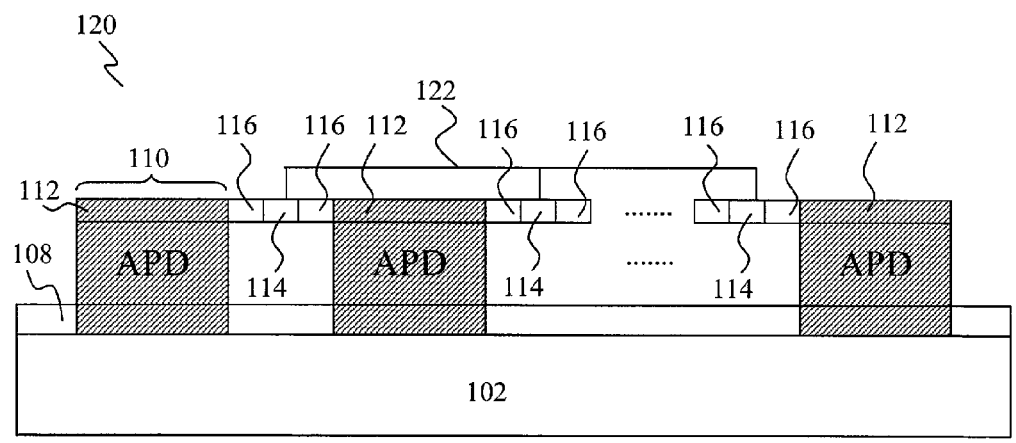
FIG. 1B shows a cross-sectional representation of a semiconductor photomultiplier device, according to various embodiments, based on the embodiment of FIG. 1A.

FIG. 1B shows a cross-sectional representation of a semiconductor photomultiplier device 120, according to various embodiments, based on the embodiment of FIG. 1A. As illustrated in FIG. 1B, the semiconductor photomultiplier device 120 may include a plurality of cells, e.g. 110, each cell including an avalanche photodiode (APD). It should be appreciated that features of the semiconductor photomultiplier device 120 are denoted using the same respective reference numerals based on like features of the semiconductor photomultiplier device 100.

In the context of various embodiments, the term "active region" may mean a region where light or photon may be absorbed so that free carriers may be generated.

In the context of various embodiments, the term "contact region" may mean a region which may provide an ohmic contact with the active region 112, and where an electrical interconnection (for example as represented by 122 in FIG. 1B), e.g. a metal wire, may be coupled to.

In the context of various embodiments, the term "substrate" may mean a device layer.

In various embodiments, a surface of the active region 112 may lie on the front side 104 of the substrate 102. This may mean that a surface of the substrate 102 on the front side 104 may also form the surface of the active region 112. The active region 112 may be formed embedded or into the substrate 102.

In various embodiments, a surface of the contact region 114 may lie on the front side 104 of the substrate 102. This may mean that a surface of the substrate 102 on the front side 104 may also form the surface of the contact region 114. The contact region 114 may be formed embedded or into the substrate 102.

In various embodiments, the contact region 114 may at least substantially surround the active region 112. Therefore, the contact region 114 may form a contact ring around the active region 112. The contact region 114 may define an ohmic contact between the active region 112 and, for example, an electrical interconnection (e.g. a metal wire).

In various embodiments, the contact region 114 may be a continuous region. In addition, it should be appreciated that the contact region 114 may be discontinuous. This may mean that the contact region 114 may be defined by a plurality of portions arranged spaced apart from each other, where the plurality of portions at least substantially surrounds the active region 112.

In the context of various embodiments, a high resistance may be required for effective quenching in SiPM applications.

In various embodiments, instead of a contact ring for providing the ohmic contact, a small contact via may be formed, for example over or on the active region 112, for electrical connection between the active region 112 and an electrical interconnection (e.g. a metal wire). However, there may be challenges in that, when an avalanche process is triggered, a high avalanche current may flow through the small contact hole, for example having a dimension of a few microns, and a very large current intensity may be observed in this small area, where the diode may get "burnt-out" and may not be able to work anymore.

In the context of various embodiments, the separation region 116 may be between about 0.1 µm and about 2 µm, for example between about 0.1 µm and about 1.5 µm, between about 0.1 µm and about 1 µm, between about 0.1 µm and about 0.5 µm, between about 0.5 µm and about 2 µm or between about 0.5 µm and about 1 µm. This means that the active region 112 and the contact region 114 may be separated from each other by a distance of between about 0.1 µm and about 2 µm, corresponding to the width of the separation region 116.

In various embodiments, the separation region 116 may have a resistance that is higher than respective resistances of the active region 112 and the contact region 114.

In various embodiments, the active region 112 may be formed in a first portion of the substrate 102, and wherein the contact region 114 may be formed in a second portion of the substrate 102, the first portion being spaced apart from the second portion by the separation region 116.

The semiconductor photomultiplier device 100 may further include an electrical interconnection (e.g. a metal wire) electrically coupled to the contact region 114.

In various embodiments, the area of the front side 104 to which the active region 112 is adjacent to may be free of one or more electrical interconnections. This means that there may be no electrical interconnection on the front side 104 of the substrate 102 where the active region 112 may be positioned in the substrate 102.

In various embodiments, the contact region 114 may include dopants of the second conductivity type at a concentration higher than dopants of the second conductivity type in the active region 112.

In various embodiments, the cell 110 may further include an intermediate region of the first conductivity type between the active region 112 and the common electrode 108. The intermediate region may at least substantially contact the active region 112. The intermediate region may include dopants of the first conductivity type at a concentration lower than dopants of the first conductivity type in the common electrode 108.

In various embodiments, the cell 110 may further include an intermediate region of the second conductivity type between the active region 112 and the common electrode 108. The intermediate region may be spaced apart from the active region 112. The intermediate region may include dopants of the second conductivity type at a concentration equal to or lower than dopants of the second conductivity type in the active region 112.

The semiconductor photomultiplier device 100 may include a plurality of cells, each cell including a respective active region (e.g. 112) of the second conductivity type adjacent to the front side 104. The common electrode 108 may be shared by the plurality of cells. A non-limiting example of the semiconductor photomultiplier device 100 with a plurality of cells may be as illustrated in FIG. 1B.

In the context of various embodiments, the separation region 116 may define a resistance between the active region 112 and the contact region 114. For example, the separation region 116 may define a bulk resistance. In various embodiments, depending on the required resistance, the contact region 114 may be continuous or discontinuous. In embodiments where the contact region 114 may be continuous, the separation region 116 may be continuous in between the active region 112 and the contact region 114, where the length of the resistor may be the gap width, which may be short, between the active region 112 and contact region 114, while the width of the resistor may be the perimeter of the active region 112, which may be wide. As a result, the resistance of the resistor may be relatively low. In embodiments where the contact region 114 may be discontinuous, the contact region 114 may be defined by a plurality of portions arranged spaced apart from each other, where the plurality of portions at least substantially surrounds the active region 112. Having a contact region 114 which is discontinuous, defined by a plurality of portions, may achieve a high resistance, or at least higher than the resistance provided by a contact region 114 which is at least substantially continuous. In embodiments having a contact region 114 which is discontinuous, the whole resistor may be regarded as the shunt connection of a plurality of independent bulk-Si resistors. In various embodiments, additionally or as an alternative, the resistance may also be varied by changing the width of the separation region 116, which may be between about 0.1 μm and about 2 μm. A separation width larger than about 2 μm may also be provided.

In the context of various embodiments, the first conductivity type may be n-type conductivity type and the second conductivity type may be p-type conductivity type, or the first conductivity type may be p-type conductivity type and the second conductivity type may be n-type conductivity type. By providing opposite types of conductivity type, a diode, in the form of a pn junction, may be formed.

In the context of various embodiments, a region of a p-type conductivity type may mean that the region is p-doped, meaning that a host material of the region is doped with doping atoms that may accept weakly-bound outer electrons from the host material, thereby creating vacancies left behind by the electrons, known as holes. Such doping atoms are also generally referred to as acceptor atoms.

In the context of various embodiments, a region of an n-type conductivity type may mean that the region is n-doped, meaning that a host material of the region is doped with doping atoms that may provide extra conduction electrons to the host material, thereby resulting in an electrically conductive n-doped host material with an excess number of mobile electrons (negatively charged carriers). Such doping atoms are also generally referred to as donor atoms.

In the context of various embodiments, where the host material may be for example silicon, which is a Group IV element, the host material may be doped or implanted with Group III doping atoms or elements, for example boron (B), aluminium (Al) or gallium (Ga), to form a p-doped material, or doped or implanted with Group V doping atoms or elements, for example phosphorus (P), arsenic (As) or antimony (Sb), to form an n-doped material.

In the context of various embodiments, the front side 104 or the surface of the front side 104 may be free of resistors (e.g. integrated resistors), for example such as polysilicon (poly-Si) resistors.

In the context of various embodiments, the semiconductor photomultiplier device 100 may be a silicon photomultiplier (SiPM) device. However, it should be appreciated that other semiconductor materials may be used for achieving the semiconductor photomultiplier devices of various embodiments, although there may be challenges in terms of the dark current and the wafer cost. Therefore, in other words, the semiconductor photomultiplier device 100 may include or may be made of a semiconductor material.

Figure 2A:
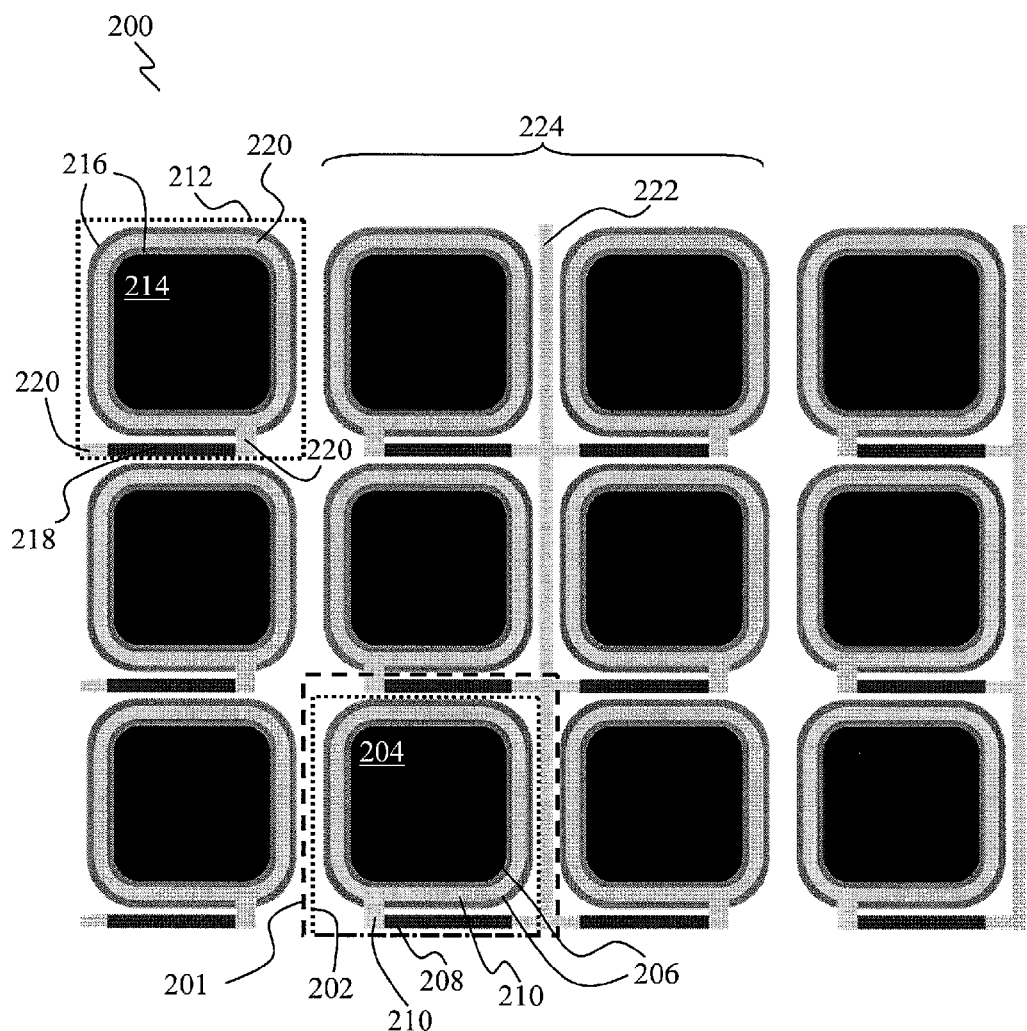
FIG. 2A shows a schematic top view of a part of a silicon photomultiplier (SiPM) device.

FIG. 2A shows a schematic top view of a part of a silicon photomultiplier (SiPM) device 200, illustrating an example of a SiPM array 200. As a non-limiting example, the SiPM array or device 200 is shown with 12 SiPM cells, where one SiPM cell may be as represented within the dotted line box 202.

Using the SiPM cell 202 as an example, the SiPM cell 202 includes a detection window 204 which represents a region or area through which light or photon may pass into the SiPM cell 202, an active region 206 which represents a region or area where light that passes through the detection window 204 may be absorbed, a resistor (e.g. an integrated resistor) 208, and one or more metal wires 210. The resistor 208 may act as a quenching resistor for the diode of the SiPM cell 202. The metal wire(s) 210 may be employed for example to connect the diode and the resistor 208, and for electrical connections between the SiPM cell 202 with other SiPM cells of the SiPM device 200.

Figure 2B:
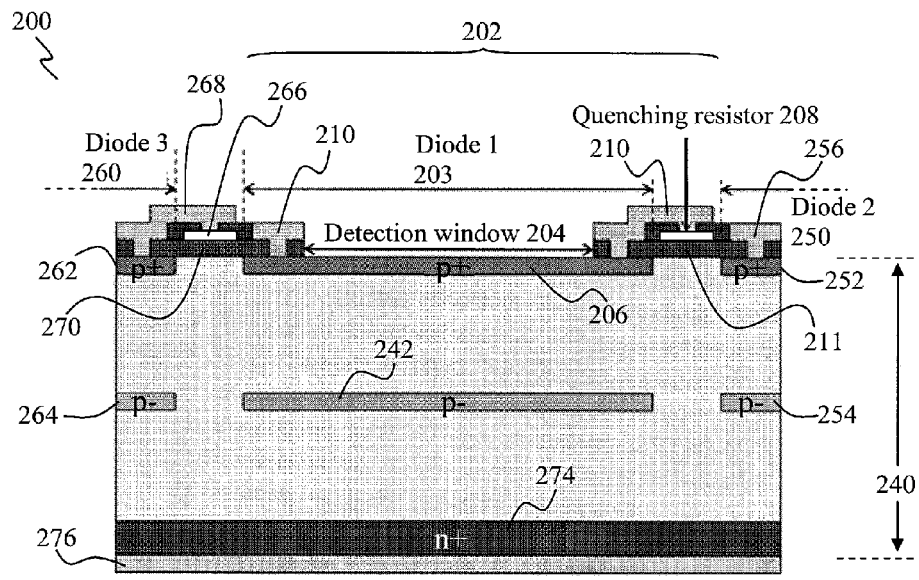
FIGS. 2B and 2C show respective schematic cross-sectional views of a silicon photomultiplier (SiPM) cell of a part of a silicon photomultiplier (SiPM) device.
Figure 2C:
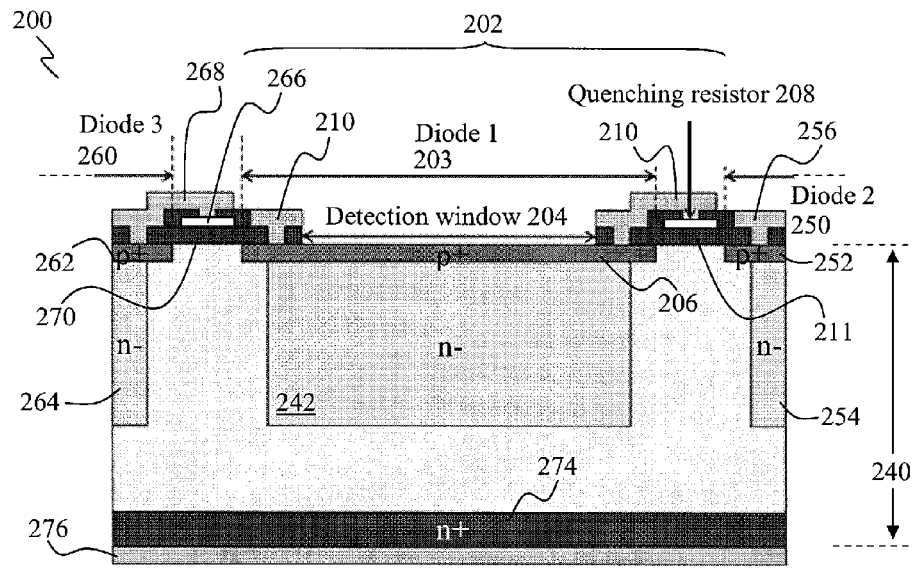
Figure 2D:
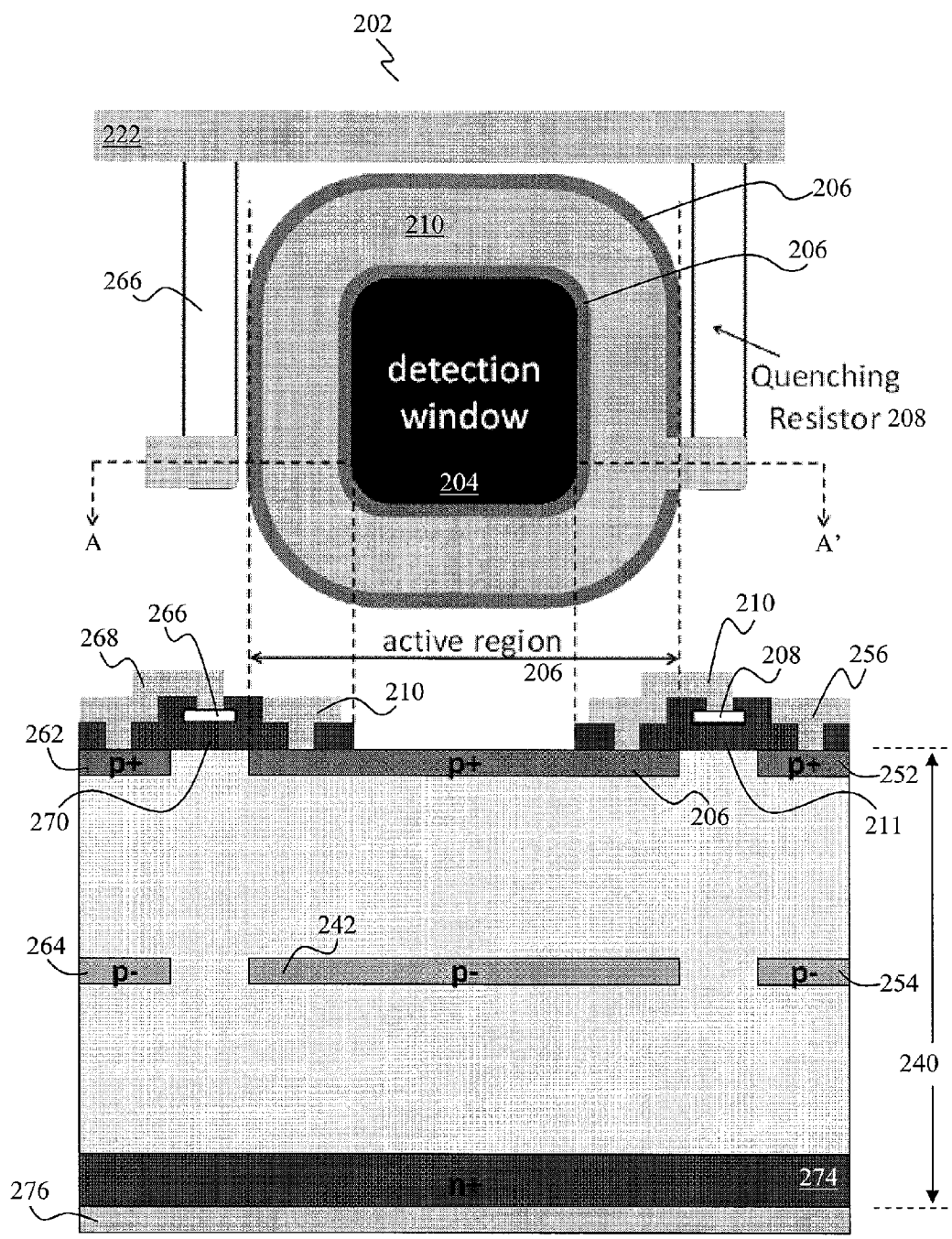
FIG. 2D shows a schematic top view of a silicon photomultiplier (SiPM) cell and a cross-sectional view taken along the line A-A' of the top view of the silicon photomultiplier (SiPM) cell.

While not clearly shown in FIG. 2A, it should be appreciated that the active region 206 may span and overlap with the areas of the detection window 204 and the metal wire(s) 206, as may be shown in FIGS. 2B, 2C and 2D.

It should be appreciated that descriptions relating to the SiPM cell 202 may similarly be applicable to any one or each of the other SiPM cells of the SiPM device 200. For example, the SiPM cell 212 includes a detection window 214, an active region 216, a resistor (e.g. an integrated resistor) 218, and one or more metal wires 220.

The SiPM device 200 may include one or more common or shared metal wires, e.g. 222, which may be shared by a group of six SiPM cells, including the SiPM cell 202, as indicated by 224.

FIGS. 2B and 2C show respective schematic cross-sectional views of a silicon photomultiplier (SiPM) cell of a part of a silicon photomultiplier (SiPM) device 200, for example for the SiPM cell 202 of FIG. 2A.

FIG. 2B shows a SiPM cell 202 with a SACM (Separation of Absorption, Charge, Multiplication) structure. The SiPM cell 202 includes a diode (Diode 1) 203, which may include a detection window 204, and an active region 206, which may be highly doped (e.g. p+ region), formed adjacent to a front side of the substrate (e.g. silicon (Si) substrate) 240. The diode 203 may further include a lightly doped (e.g. p− region) region 242 formed within or embedded in the substrate 240, as an intermediate region. The p− region 242 may be arranged beneath the active region 206 and spaced apart from the active region 206. The SiPM cell 202 further includes a quenching resistor 208, which may be electrically coupled to the active region 206 via a metal wire 210. The SiPM cell 202 may further include a passivation or insulating layer 211.

Also shown in FIG. 2B are diodes corresponding to respective SiPM cells adjacent to the SiPM cell 202. For example, a second diode (Diode 2) 250 with its corresponding p+ region (active region) 252, p− region 254 and metal wire 256 are shown to the right side of the diode 203, while a third diode (Diode 3) 260 with its corresponding p+ active region 262, p− region 264, quenching resistor 266, metal wire 268 and passivation layer 270. The passivation layer 211, 270 may be a continuous layer at least substantially around the detection window 204.

The SiPM device 200 may include a common electrode 274 formed adjacent to a back side of the substrate 240. The common electrode 274 may be highly doped, of a conductivity type (e.g. "n+"-doped) opposite to that of the active region 206. Using diode 203 as an example, a diode may therefore be formed between the p+ region 206 and the n+ common electrode 274. The common electrode 274 may be shared by the diode 203, the second diode 250 and the third diode 260, and may be a continuous electrode. The SiPM device 200 may further include a metal wire 276 adjacent the common electrode 274. Using the diode 203 as an example, the p− region 242 is arranged in between the active region 206 and the common electrode 274, and spaced part from each of the active region 206 and the common electrode 274, for example arranged midway relative to the active region 206 and the common electrode 274.

FIG. 2C shows a SiPM cell 202 with a reach-through structure. The reach-through structure may be similar to that of the SACM structure of FIG. 2B except that the lightly doped region 242 of the reach-through structure may be of a conductivity type (e.g. "n−"-doped) opposite to that of the active region 206, and that the lightly doped intermediate region 242 is formed adjacent and in contact with the active region 206 and extends into the substrate 240 towards the common electrode 274.

FIG. 2D shows a schematic top view of a silicon photomultiplier (SiPM) cell 202 and a cross-sectional view taken along the line A-A' of the top view of the SiPM cell 202, for example corresponding to the portion represented by the dashed box 201 in FIG. 2A, illustrating the correlation of the different features of the SiPM cell 202 between the top view and the cross-sectional view.

As illustrated in FIGS. 2B, 2C and 2D, only part of the device surface, for example corresponding to the detection window 204 of the diode 203, on the front side of the substrate 240, is adopted to collect incident photons. The areas outside the detection windows 204 are assigned to accommodate the metal wires 210, 256, 268, integrated resistors 208, 266, and so on. In addition, large areas of the active region 206 are used to accommodate the metal wire 210. Therefore, photons launched in these "dead regions" (areas outside the detection window 204) are quite unlikely to be detected.

Fill Factor (FF), which is the area ratio between the detection window (e.g. 204) and the surface of the whole device, is an important parameter for SiPM. The higher the fill factor is, the higher the detection efficiency will be. Therefore, a small area detection window and/or large area "dead regions" may lead to a small fill factor and, consequently a low detection efficiency.

Nevertheless, fill factor is not the only consideration in designing a SiPM cell. Trade-offs between the fill factor and the following concerns or requirements may also need to be taken into consideration in the design and fabrication of a device: (A) certain amount of areas need to be spared or provided for metal wires and integrated resistors; (B) the separation between adjacent cells should be large enough to reduce or minimise the crosstalk to an acceptable level; (C) rounded corners of the cell (for example as shown in FIGS. 2A and 2D) may be necessary to avoid or minimise edge breakdown of the electric field; and (D) extra structures may be required, for example to enhance the device performances, such as guard rings and isolation trenches.

The above-mentioned considerations, as well as the fabrication technologies used, may restrict the fill factor of a SiPM device. Nevertheless, when the specific configuration or structure has been determined for a SiPM device, its fill factor may be improved by an increase of the cell dimension, because the area of the detection window generally increases faster than that of the dead region. However, there may be challenges in that large-area diodes may put forward a higher requirement on the fabrication process (for example material growth).

With reference to FIGS. 2B, 2C and 2D, the p+ region (active region) serves as both the active region and the contact region of the SiPM cell. For example, the p+ region (active region) 206 functions as the active region, where light or photon may be absorbed and where free carriers may be generated as a result, as well as being the contact region, where the metal wire 210 may be electrically coupled or connected to, for the SiPM cell 202.

Each p+ region, e.g. 206, 252, 262, may be highly doped in order to maintain the uniformity of electric field and also achieve at least substantially perfect or optimum ohmic contact between metal (e.g. the metal wire, e.g. 210, 256, 268), and silicon (Si) (e.g. of the p+ region, e.g. 206, 252, 262, and the substrate 240), where both requirements may be quite critical for SiPM devices. However, the detection window, e.g. 204, overlaps this highly doped p+ region, e.g. 206. As a result, the photo-generated electrons may likely to get recombined in this p+ region, e.g. 206, which may accordingly reduce the quantum efficiency (QE) of the device 200, for example for light with short wavelength. In other words, as the highly doped p+ regions, e.g. 206, 252, 262, serve as both the active region and the contact region, electrons that are photo-generated in the highly doped p+ regions, e.g. 206, 252, 262, may be recombined in the highly doped p+ regions, e.g. 206, 252, 262, thereby reducing the QE of the device 200.

Figure 3A:
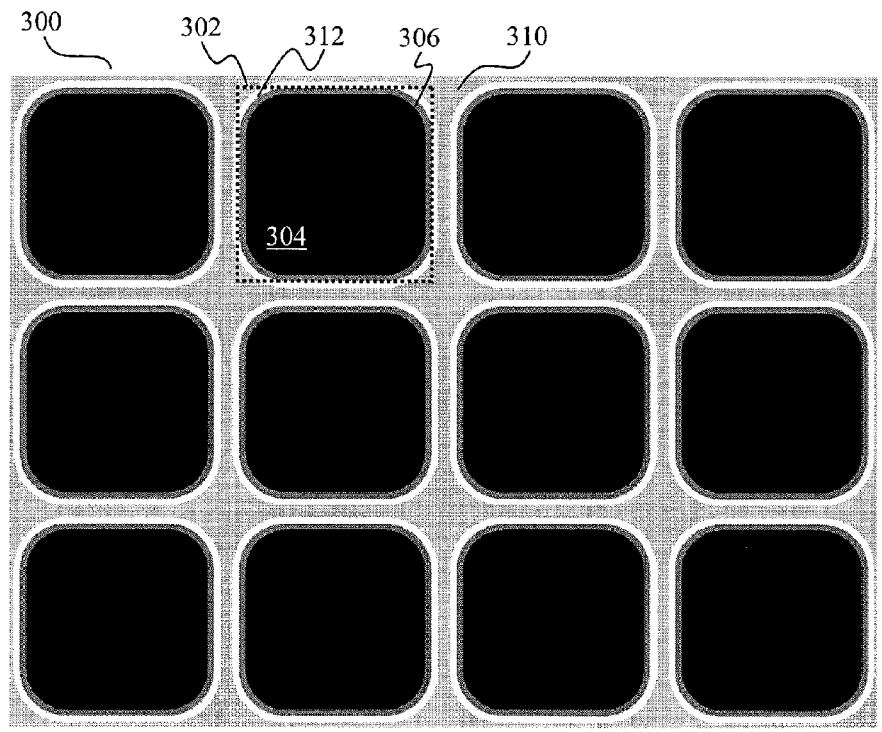
FIG. 3A shows a schematic top view of a part of a silicon photomultiplier (SiPM) device, according to various embodiments.

FIG. 3A shows a schematic top view of a part of a silicon photomultiplier (SiPM) device 300, according to various embodiments, illustrating an example of a SiPM array 300. As a non-limiting example, the SiPM array or device 300 is shown with 12 SiPM cells, where one SiPM cell may be as represented within the dotted line box 302.

Using the SiPM cell 302 as an example, the SiPM cell 302 includes a detection window 304 which represents a region or area through which light or photon may pass into the SiPM cell 302, an active region 306 which represents a region or area where light that passes through the detection window 304 may be absorbed, and one or more metal wires 310. The detection window 304 and the active region 306 may form a diode or part of a diode of the SiPM cell 302. Also illustrated in FIG. 3A is a separation region 312 which at least substantially surrounds the detection window 304 and the active region 306. The separation region 312 may define a bulk quenching resistor (e.g. bulk Si resistor) for the diode of the SiPM cell 302, as will be described with reference to FIG. 3B later. The metal wire 310 may be employed for example for electrical connection to the diode and the separation region 312, and for electrical connections between the SiPM cell 302 with other SiPM cells of the SiPM device 300.

Figure 3B:
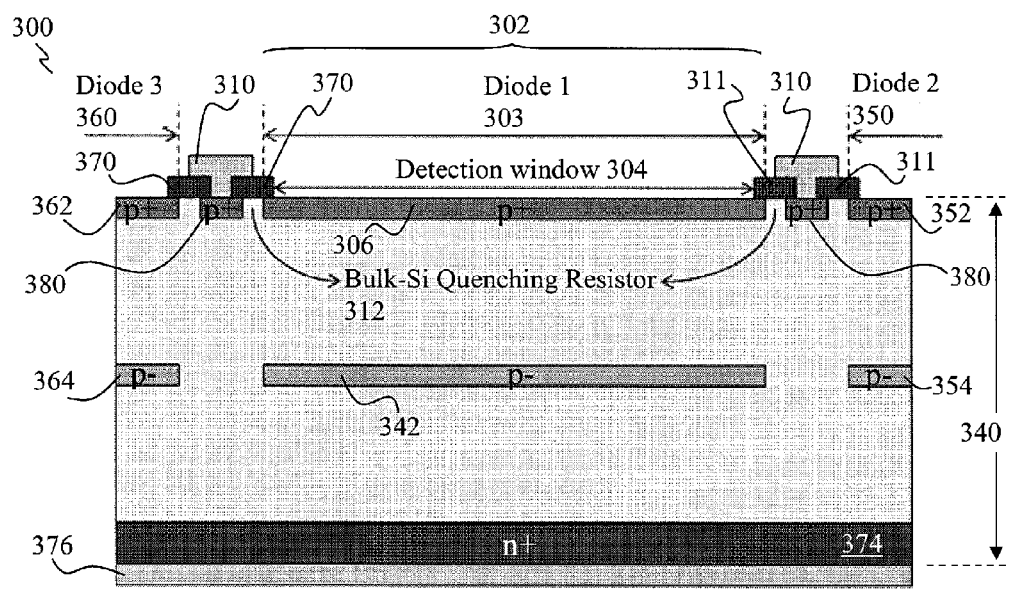
FIGS. 3B and 3C show respective schematic cross-sectional views of a silicon photomultiplier (SiPM) cell of a part of a silicon photomultiplier (SiPM) device, according to various embodiments.
Figure 3C:
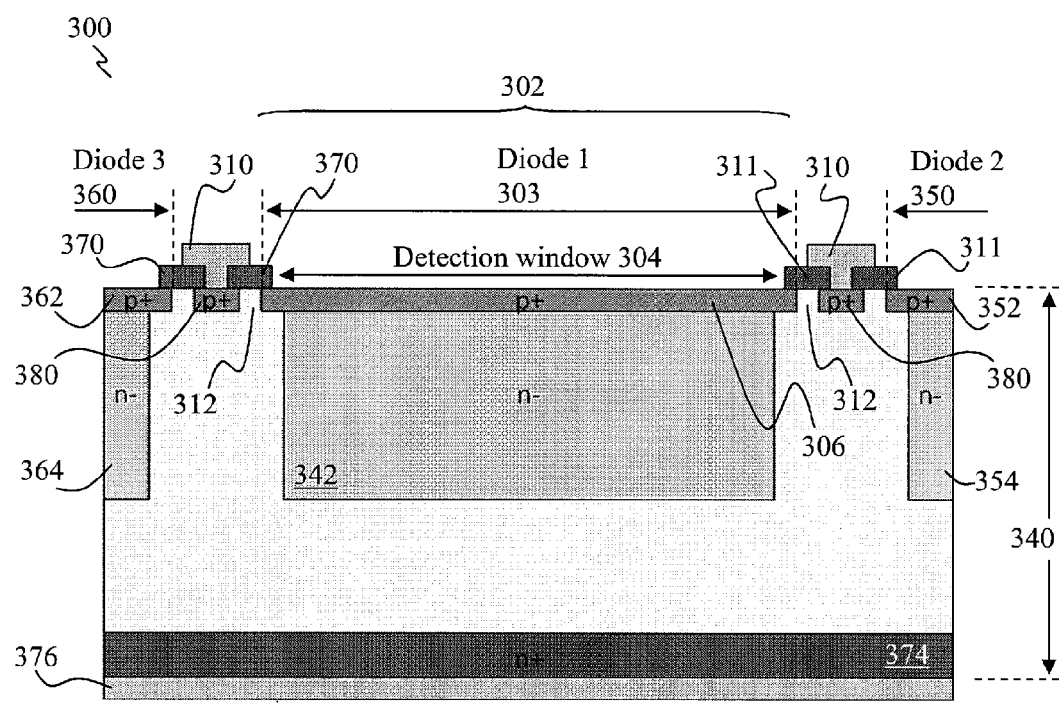
Figure 3D:
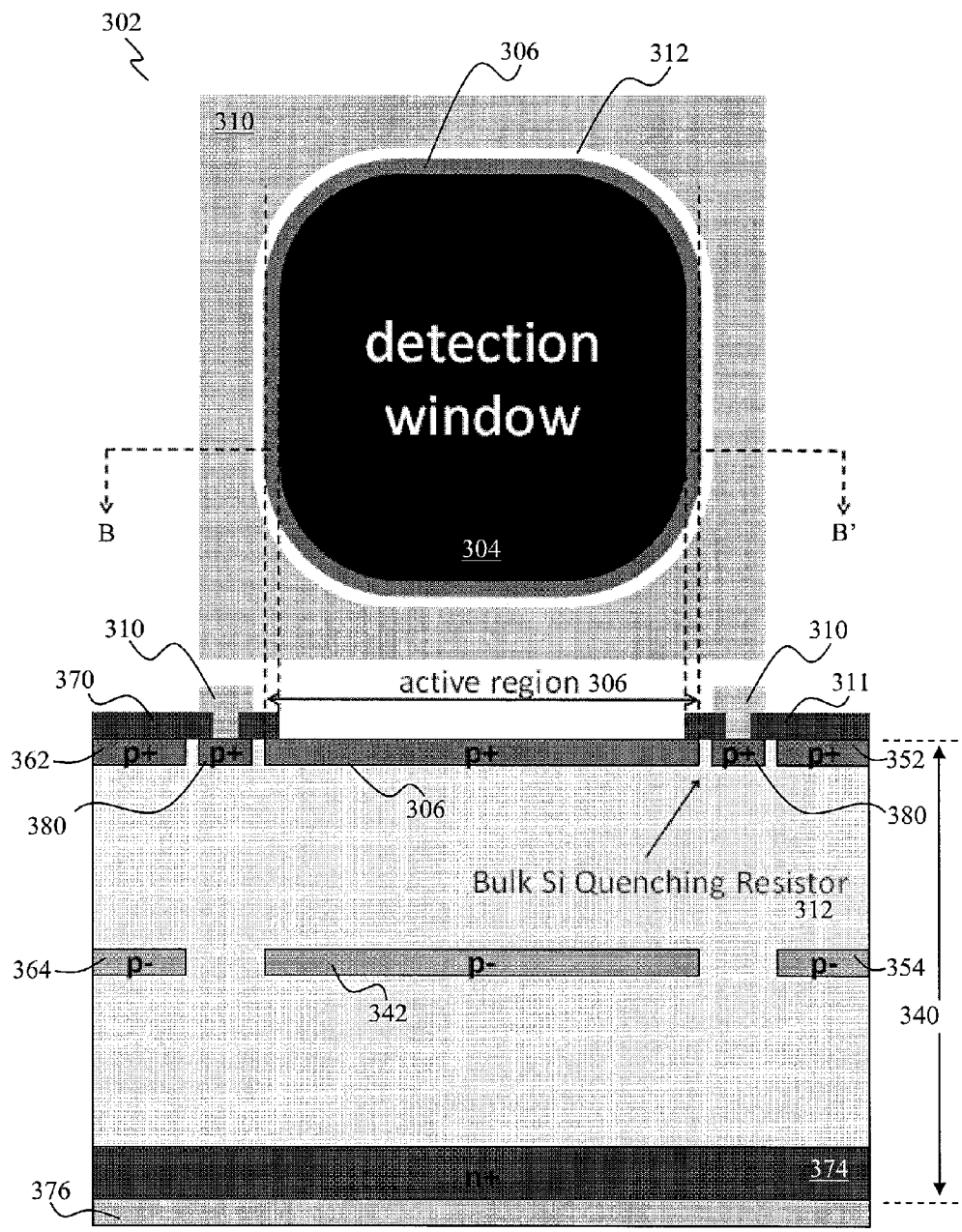
FIG. 3D shows a schematic top view of a silicon photomultiplier (SiPM) cell and a cross-sectional view taken along the line B-B' of the top view of the silicon photomultiplier (SiPM) cell.

While not clearly shown in FIG. 3A, it should be appreciated that the active region 306 may span and overlap with the area of the detection window 304, as may be shown in FIGS. 3B, 3C and 3D.

It should be appreciated that descriptions relating to the SiPM cell 302 may similarly be applicable to any one or each of the other SiPM cells of the SiPM device 300. The metal wire 310 may be shared by the SiPM cells, including the SiPM cell 302, of the SiPM device 300.

FIG. 3B shows a schematic cross-sectional view of a silicon photomultiplier (SiPM) cell of a part of a silicon photomultiplier (SiPM) device 300, according to various embodiments, for example for the SiPM cell 302 of FIG. 3A.

FIG. 3B shows a SiPM cell 302 with a SACM (Separation of Absorption, Charge, Multiplication) structure. The SiPM cell 302 includes a diode (Diode 1) 303, which may include a detection window 304, and an active region 306, which may be highly doped (e.g. p+ region), formed adjacent to a front side of the substrate (e.g. silicon (Si) substrate) 340. The diode 303 may further include a lightly doped (e.g. p– region) region 342 formed within or embedded in the substrate 340, as an intermediate region. The p– region 342 may be arranged beneath the active region 306 and spaced apart from the active region 306.

The SiPM cell 302 may further include a contact region (e.g. p+ region) 380, which may be highly doped, formed adjacent to the front side of the substrate 340. The contact region 380 may be formed laterally from the active region 306, and spaced apart from the active region 306 by the separation region 312, which defines a bulk quenching resistor between the active region 306 and the contact region 380. The contact region 380 may at least substantially surround the active region 306. The contact region 380 may be electrically coupled to the metal wire 310. The metal wire 310 may be shared by adjacent SiPM cells of the SiPM device 300. The SiPM cell 302 may further include a passivation or insulating layer 311.

Also shown in FIG. 3B are diodes corresponding to respective SiPM cells adjacent to the SiPM cell 302. For example, a second diode (Diode 2) 350 with its corresponding p+ region (active region) 352 and p– region 354 are shown to the right side of the diode 303, while a third diode (Diode 3) 360 with its corresponding p+ active region 362, p– region 364, and passivation layer 370. The passivation layer 311, 370 may be a continuous layer at least substantially around the detection window 304.

The SiPM device 300 may include a common electrode 374 formed adjacent to a back side of the substrate 340. The common electrode 374 be highly doped, of a conductivity type (e.g. "n+"-doped) opposite to that of the active region 306. Using diode 303 as an example, a diode may therefore be formed between the p+ region 306 and the n+ common electrode 374. The common electrode 374 may be shared by the diode 303, the second diode 350 and the third diode 360 (e.g. shared by adjacent SiPM cells), and may be a continuous electrode. The SiPM device 300 may further include a metal wire 376 adjacent the common electrode 374. Using the diode 303 as an example, the p– intermediate region 342 is arranged in between the active region 306 and the common electrode 374, and spaced part from each of the active region 306 and the common electrode 374, for example arranged midway relative to the active region 306 and the common electrode 374.

It should be appreciated that besides the SACM structure as shown in FIG. 3B, many other device configurations, such as the reach-through structure, may also be adopted to realize the SiPM devices of various embodiments. FIG. 3C shows a SiPM cell 302 with a reach-through structure. The reach-through structure may be similar to that of the SACM structure of FIG. 3B except that the lightly doped region 342 of the reach-through structure may be of a conductivity type (e.g. "n–"-doped) opposite to that of the active region 306, and that the lightly doped intermediate region 342 is formed adjacent and in contact with the active region 306 and extends into the substrate 340 towards the common electrode 374.

FIG. 3D shows a schematic top view of a silicon photomultiplier (SiPM) cell 302 and a cross-sectional view taken along the line B-B' of the top view of the SiPM cell 302, for example corresponding to the portion represented by the dotted box 302 in FIG. 3A, illustrating the correlation of the different features of the SiPM cell 302 between the top view and the cross-sectional view.

Figure 3E:
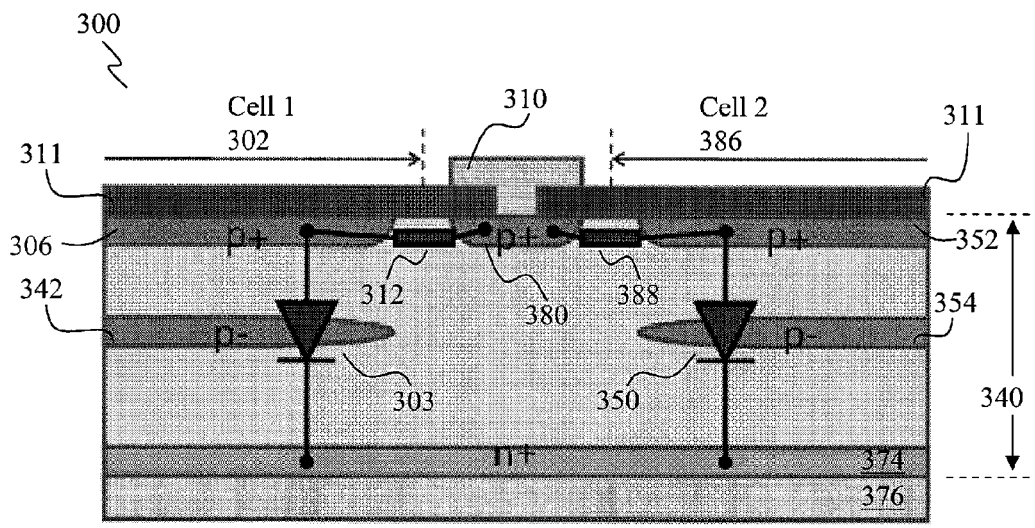
FIG. 3E shows a schematic cross-sectional view of a part of a silicon photomultiplier (SiPM) device with a SACM (Separation of Absorption, Charge, Multiplication) structure, according to various embodiments.

FIG. 3E shows a schematic cross-sectional view of a part of a silicon photomultiplier (SiPM) device 300 with a SACM (Separation of Absorption, Charge, Multiplication) structure, according to various embodiments, for two adjacent SiPM cells in the form of Cell 1 302 and Cell 2 386. FIG. 3E illustrates the symbolic representations of the bulk quenching resistor 312 between the contact region 380 and the active region 306 corresponding to Cell 1 302, the diode 303, formed through the active region 306, the intermediate region 342 and the common electrode 374, corresponding to Cell 1 302, the bulk quenching resistor 388 between the contact region 380 and the active region 352 corresponding to Cell 2 386, and the diode 350, formed through the active region 352, the intermediate region 354 and the common electrode 374, corresponding to Cell 2 386.

Using the bulk resistor 312 as an example, the bulk resistor 312 is laterally defined by the separation region, and is inherently in series with the diode 303. As the diode 303 and the resistor 312 are connected to each other in the substrate (e.g. Si) bulk 340, no metal wires may be needed within Cell 1.

Figure 3F:
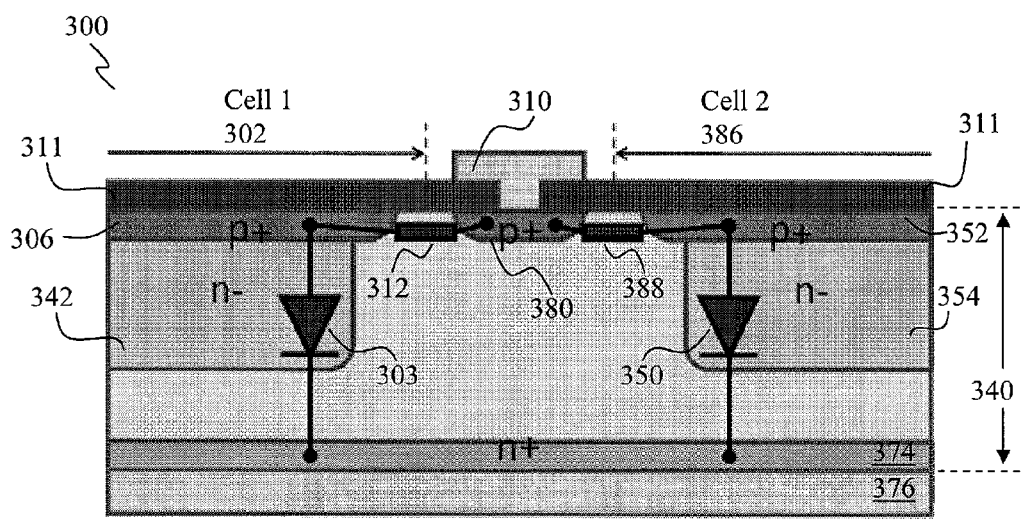
FIG. 3F shows a schematic cross-sectional view of a part of a silicon photomultiplier (SiPM) device with a reach-through structure, according to various embodiments.

FIG. 3F shows a schematic cross-sectional view of a part of a silicon photomultiplier (SiPM) device 300 with a reach-through structure, according to various embodiments, for two adjacent SiPM cells in the form of Cell 1 302 and Cell 2 386. FIG. 3F illustrates the symbolic representations of the bulk quenching resistor 312 between the contact region 380 and the active region 306 corresponding to Cell 1 302, the diode 303, formed through the active region 306, the intermediate region 342 and the common electrode 374, corresponding to Cell 1 302, the bulk quenching resistor 388 between the contact region 380 and the active region 352 corresponding to Cell 2 386, and the diode 350, formed through the active region 352, the intermediate region 354 and the common electrode 374, corresponding to Cell 2 386.

As can be seen in FIGS. 3B to 3F, no metal wires may be found in the active region 306 and almost all or a substantially large portion of the active area of the SiPM cell 302 may be used for light detection, as defined by the detection window, e.g. 304. As no metal wires are present or necessary in the active regions, e.g. 306, the SiPM device 300 may have larger detection windows, e.g. 304, for example as compared to the SiPM device 200 (FIGS. 2A to 2D). Therefore, the fill factor for the SiPM cell 302 and the overall SiPM device 300 may be increased, as compared to the SiPM device 200. Consequently, the SiPM cell 302 may also have a high detection efficiency.

Furthermore, in various embodiments, no poly-Si resistors may be necessary in the SiPM device 300 of various embodiments, which may accordingly simplify the fabrication process and reduce the fabrication cost, as no poly-Si related processes may be required. As the SiPM device 300 includes a separation region, e.g. 312, providing an inherent diode-resistor connection, the SiPM device 300 may be free of separate resistors, for example poly-Si resistors, which may be needed, for example in the SiPM device 200, as quenching resistors.

As can be seen in FIGS. 3B to 3F, the metal wires 310 are completely absent from the active region, e.g. 306, and are only present in the "blank" regions between adjacent cells. In addition, there may be no direct contact between the active region, e.g. 306, and the metal strip 310. Instead, another highly doped region, in the form of the contact region 380, right below the metal wire 310 is introduced, in order to achieve ohmic contact between metal (e.g. the metal wire, e.g. 310) and silicon (Si) (e.g. of the substrate 340). The contact region 380 may have the same doping type or conductivity type as that of the active region, e.g. 306. Thus, when a voltage applied, a current may flow laterally through the gap or the separation region 312 between these two highly doped active region, e.g. 306, and the contact region 380, as if the current is flowing through a resistor. In this way, the gap or the separation region 312 may serve as a lateral quenching resistor in series with the diode, e.g. 303, in a way which may be similar to the poly-Si resistor in the SiPM device 200 as shown in FIGS. 2A to 2D. Therefore, the SiPM device 300 may be named as "SiPM with lateral bulk-Si quenching resistors", or LR-SiPM (Lateral resistor-SiPM) for short. Similarly, the SiPM cell 302 may be termed as a LR-SiPM cell. In various embodiments, the lateral bulk-Si quenching resistor(s) 312 may at least substantially surround the active region 306, and thus may have a ring-like structure or pattern. Therefore, the SiPM device 300 may be termed as "Quenching Ring SiPM" or QR-SiPM.

In various embodiments, by adjusting the gap width, or in other words, the width of the separation region, e.g. 312, between the contact region, e.g. 380 and the active region, e.g. 306, the resistance of the lateral quenching resistor may be tuned or varied. As a result of the high resistivity of intrinsic Si, sufficiently high resistance may still be achieved even when the gap width is quite small. Thus, in spite of the introduction of an extra highly doped contact region, e.g. 380, in the SiPM device 300, the "blank" regions between adjacent cells may still remain as narrow as, or even narrower than, the necessary cell separation width in the SiPM device 200 or in conventional SiPM arrays.

Furthermore, as mentioned above, the p+ region, e.g. 206, in the SiPM 200 as shown in FIGS. 2A to 2D, serves not only as an active region to maintain the uniformity of electric field, but also as a contact region to achieve good ohmic contact between metal and Si. Therefore the p+ region, e.g. 206, needs to be very highly doped to simultaneously satisfy these two requirements. In contrast, in the SiPM 300, the contact region, e.g. 380 and the active region, e.g. 306, may be optimally designed and defined separately. For example, very thin and moderately doped p+ region, e.g. 306, may be sufficient for the active region to maintain the electric field uniformity. Thus, the quantum efficiency of the device 300 at short wavelengths may be improved.

The LR-SiPM device 300 of various embodiments may have one or more of the following advantages: (1) a high fill factor (FF) due to the absence of metal wires in the active region, (2) a simplified fabrication process due to omission of poly-Si related steps, (3) separate optimization of the contact region and the active region to improve the device quantum efficiency, and (4) lateral quenching resistor to achieve uniform current flow from the active region to its periphery.

Simulation and analysis of the SiPM devices of various embodiments will now be described by way of the following non-limiting examples. Numerical simulations may be performed to verify the functionality of the SiPM structure of various embodiments. Technology Computer-Aided Design (TCAD)-based software may be used to simulate the fabrication processes and the device characteristics. As an example, the SACM structure may be used to build the SiPMs under simulation. For simplicity, the layouts of the devices may have a circular symmetry, and therefore, cylindrical coordinate system may be used for the simulation. For the purpose of comparison, the performances of a conventional SiPM and a LR-SiPM of various embodiments, with comparable dimensions, may be investigated.

Figure 4A:
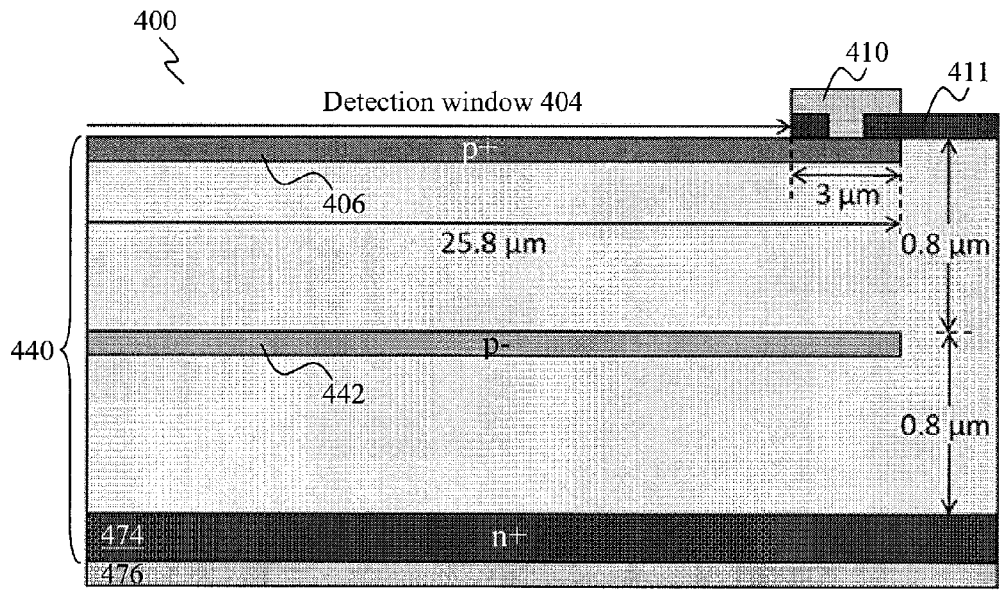
FIG. 4A shows schematic cross-sectional view of a silicon photomultiplier (SiPM) device, for simulations.
Figure 4B:
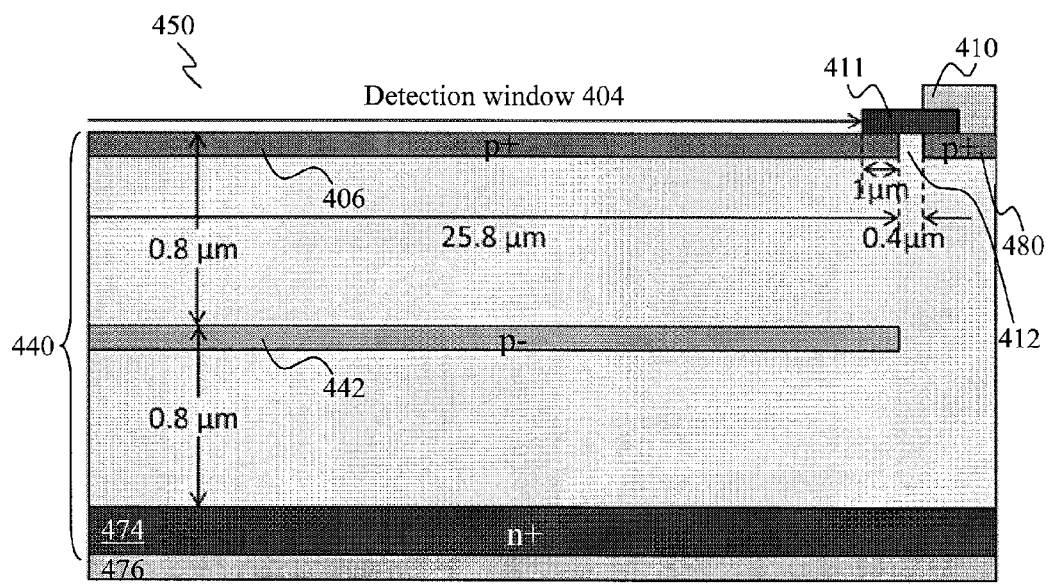
FIG. 4B shows a schematic cross-sectional view of a silicon photomultiplier device with lateral bulk-Si quenching resistors (LR-SiPM) according to various embodiments, for simulations.

FIGS. 4A and 4B respectively show schematic cross-sectional views of a silicon photomultiplier (SiPM) device 400, having a poly-Si quenching resistor (not shown), and a silicon photomultiplier with lateral bulk-Si quenching resistors (LR-SiPM) device 450, for simulations, based on the SACM structure. FIGS. 4A and 4B show the detailed structural information of the SiPM device 400 and the LR-SiPM device 450 under simulation, including the dimensions of the respective SiPM devices. Like reference numerals are denoted for like features in the SiPM device 400 and the LR-SiPM device 450. These features include a substrate 440, a detection window 404, a highly doped region (p+ region) 406, which acts as both the active region and the contact region for the SiPM device 400, and as the active region for the LR-SiPM device 450, a lightly doped intermediate region (p– region) 442, a common electrode 474, being a highly doped region (n+ region), a metal wire 410 and a passivation layer 411 on the front side of the substrate 440, and a metal wire 476 on the back side of the substrate 440. In addition, the LR-SiPM device 450 includes a contact region 480, separated by a separation region 412, from the p+ region 406. As shown in FIGS. 4A and 4B, the SiPM device 400 and the LR-SPM device 450 have an identical diode structure but different quenching schemes.

For the SiPM device 400 and the LR-SiPM device 450, the length of the p+ region 406 may be about 25.8 µm, the distance between the top surface of the substrate 440 and the top surface of the intermediate p– region 442 may be about 0.8 µm, while the distance between the top surface of the intermediate p– region 442 and the top surface of the common electrode 474 may be about 0.8 µm. For the SiPM device 400, the overlapping width between the p+ region 406 and the metal wire 410 and the passivation layer 411 may be about 3 µm. For the LR-SiPM device 450, the overlapping width between the p+ region 406 and the passivation layer 411 may be about 1 µm, and the width of the separation region 412 may be about 0.4 µm.

The charge layer (p– region) 442 may be defined by implantation of approximately $1.0 \times 10^{12}/cm^2$ boron into the epitaxial Si layer or substrate 440 under approximately 10 eV, followed by rapid thermal annealing (RTA) at about 1050° C. for about 5 seconds. The active and contact region (p+ region) 406 in the SiPM device 400 may be defined by implantation of approximately $4.0 \times 10^{15}/cm^2$ boron into the epitaxial Si layer or substrate 440 under approximately 10 eV, also followed by RTA at about 1050° C. for about 5 seconds. Substantially similar doping and annealing processes may be applied to the definition of the contact region (p+ region) 480 in the LR-SiPM 450. A varied doping dosage for the active region (p+ region) 406 in the LR-SiPM device 450 may be adopted for comparison purposes. The deposition and etching of poly-Si resistors is not defined in the process simulation of the SiPM device 400. The serial resistor may be introduced to the device 400 by defining the contact resistance between metal and Si.

The fill factor (FF) of the SiPM device 400 and the LR-SiPM device 450 may depend on the gap between adjacent cells. For example, the fill factor may increase from about 72.4% (for SiPM device 400) to 85.6% (for LR-SiPM device 450), when the gap between adjacent cells is about 2 µm for both devices. The FF increase may be attributed to the elimination of metal wires in the active regions.

As can be seen from FIGS. 4A and 4B, the SiPM device 400 and the LR-SiPM device 450 have identical active region 406 and epitaxial thickness. Based on the configurations of the SiPM device 400 and the LR-SiPM device 450, the fill factor of the LR-SiPM device 450 may be higher than that of the SiPM device 400, based at least in part due to the larger detection window 404 of the LR-SiPM device 450 as compared to that of the SiPM device 400.

The functionality of the LR-SiPM 450 may be determined through simulation. FIGS. 5A to 5E show simulation results of the LR-SiPM structure 450, with a $1 \times 10^{14}/cm^2$ doping dosage in the active region 406 above breakdown.

Figure 5A:
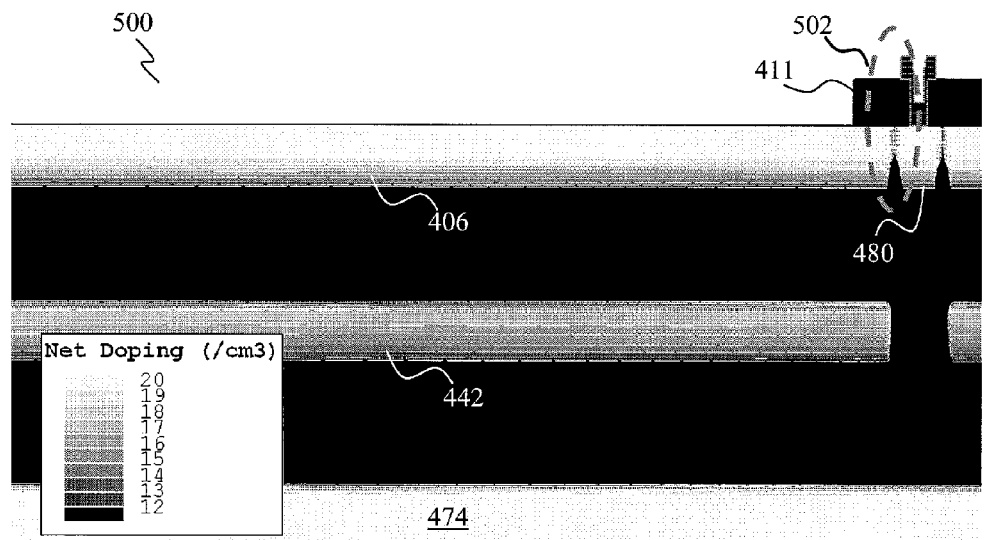
FIGS. 5A to 5E show simulation results of a silicon photomultiplier structure with lateral quenching resistors (LR-SiPM), where the doping dosage of the active region is set to be $1 \times 10^{14}/cm^2$.
Figure 5B:
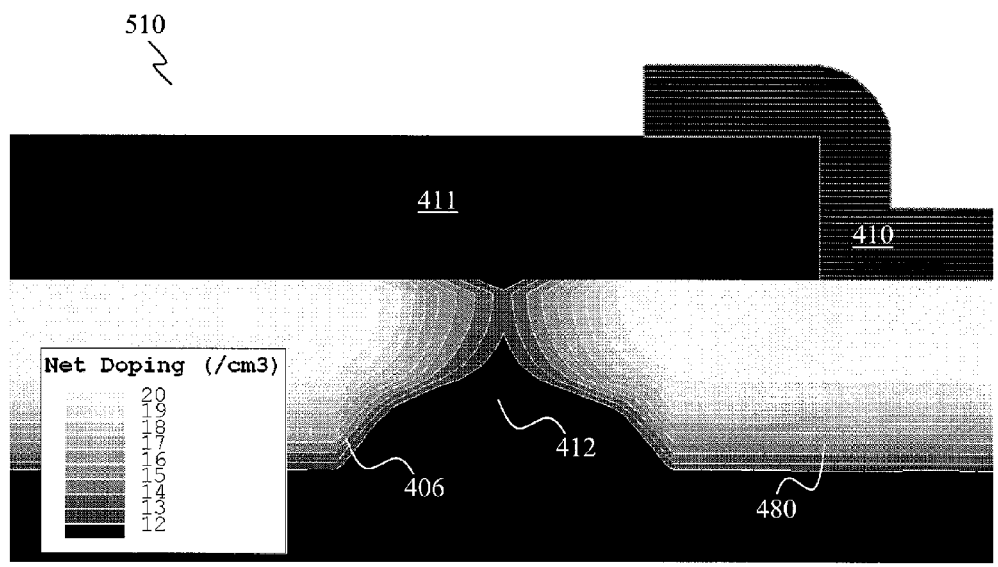
Figure 5C:
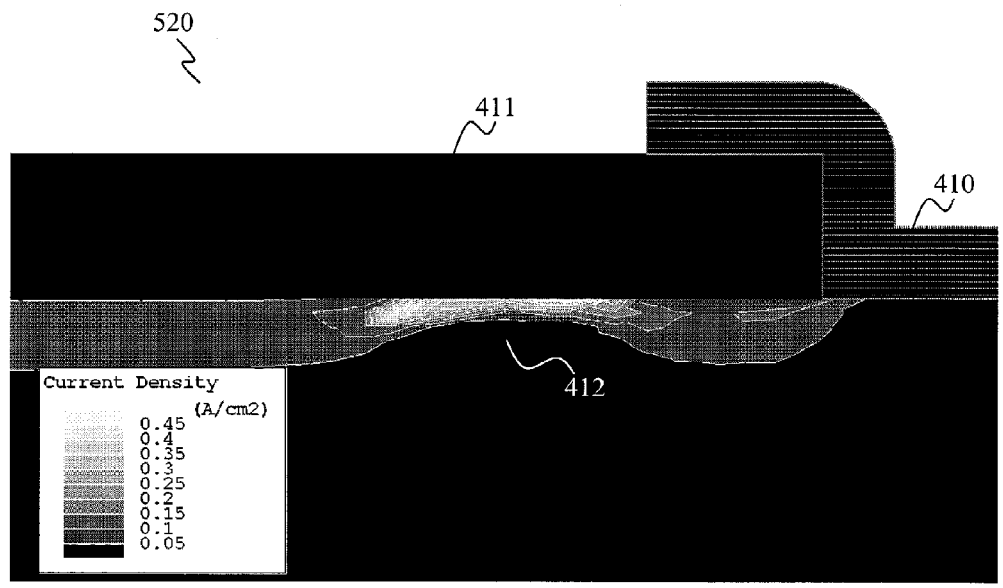

FIG. 5A shows the simulation results 500 of the doping profiles for the LR-SiPM device 450, illustrating the net doping in the different regions of the LR-SiPM device 450, while FIG. 5B shows the simulation results 510 for the LR-SiPM device 450 corresponding to the portion of the LR-SiPM device 450 within the dashed ellipse represented as 502 in FIG. 5A. The simulation results 510 show the different doping profiles for the active region 406 and the contact region 480. As may be observed, because of the diffusion during processing, the highly-doped active region 406 and the contact region 480 may extend into the 400 nm-wide gap of the separation region 412 and may almost merge with each other. When a certain reverse bias is applied to the LR-SiPM device 450, a current may flow through the 400 nm-wide gap 412, which serves as the quenching resistor. This may be confirmed by the simulation results 520 of the current density distribution, as shown in FIG. 5C illustrating the density of current that flows through the lateral resistor 412.

Figure 5D:
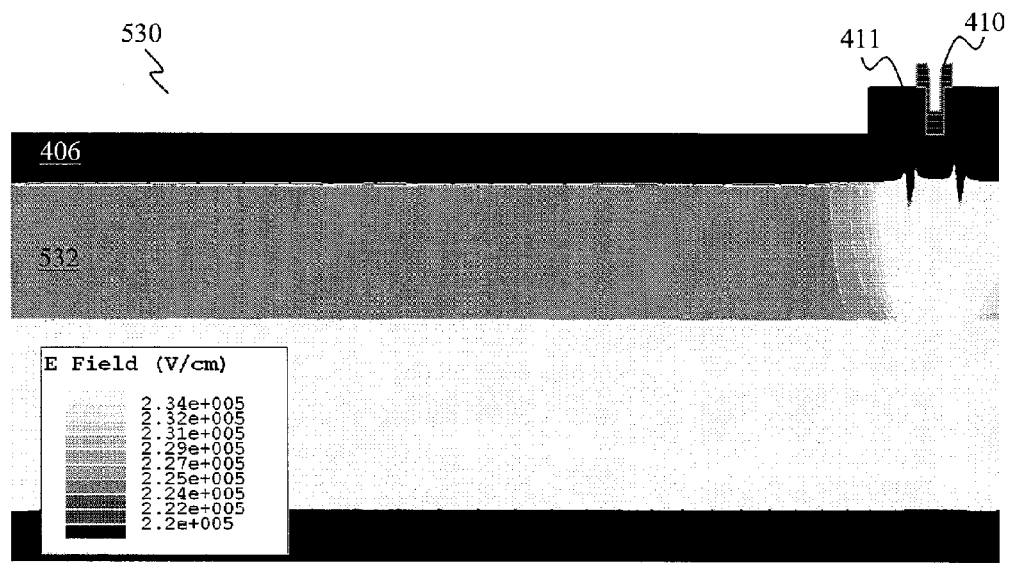
Figure 5E:
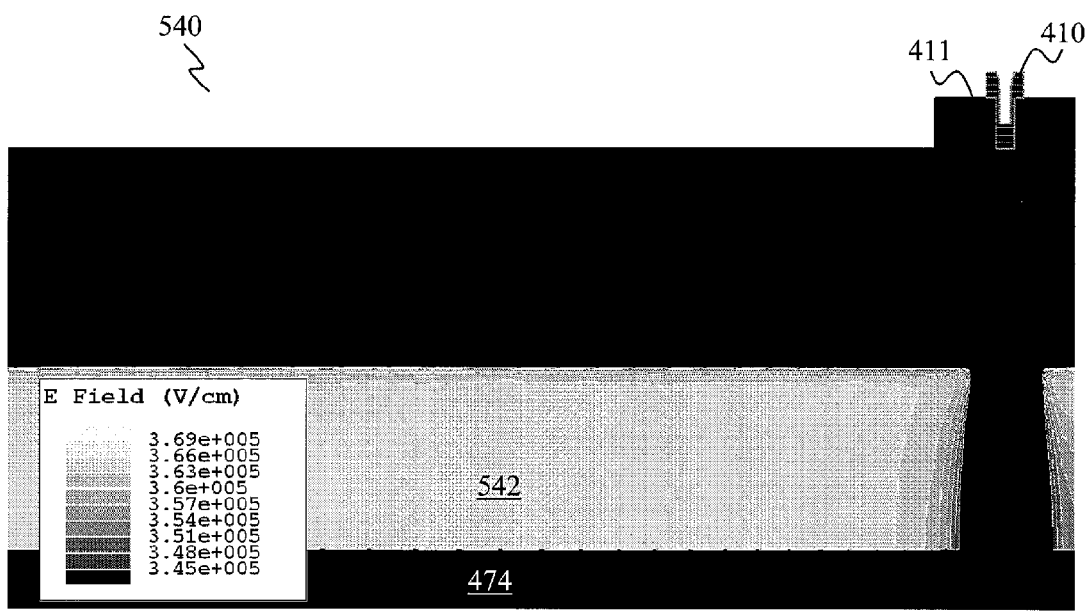

When the LR-SiPM 450 is working above the breakdown voltage, the electric field distributions in the absorption region 532, beneath the active region 406, and the multiplication region 542, above the common electrode 474, are as shown by results 530, 540 in FIGS. 5D and 5E respectively, which originated from the same simulation result and are shown in different scale of electric field range to provide a better view of the field uniformity. As may be seen, in spite of the low doping dosage of the active region 406 compared with that of the contact region 480, a very uniform electric field distribution may still be achieved in both the absorption region 532 and the multiplication region 542. The non-uniformity of electric field is less than 1% in either region.

Figure 6:
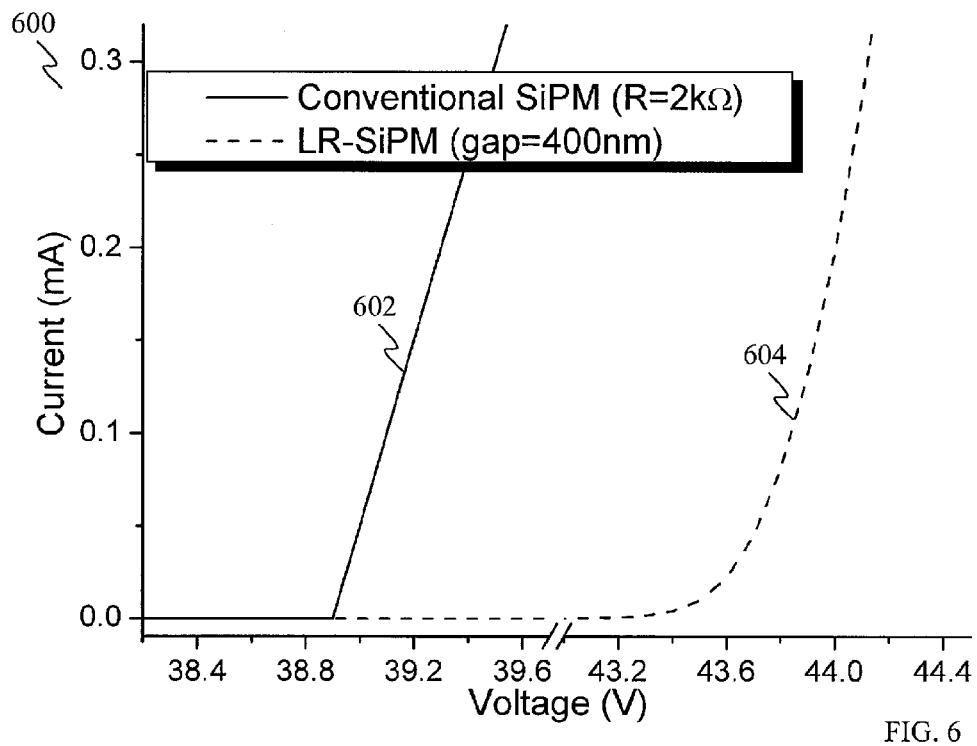
FIG. 6 shows simulated current-voltage (I-V) curves for the conventional silicon photomultiplier (SiPM) device and the silicon photomultiplier with lateral bulk-Si quenching resistors (LR-SiPM) device of FIGS. 4A and 4B.

FIG. 6 shows a simulated current-voltage (I-V) curve 602 for the silicon photomultiplier (SiPM) device 400 and a simulated current-voltage (I-V) curve 604 for the silicon photomultiplier with lateral bulk-Si quenching resistors (LR-SiPM) device 450. As may be seen, the breakdown voltage of the LR-SiPM 450 is a few voltages higher than the SiPM device 400. In addition, the lateral bulk-Si quenching resistor may not have a constant resistance. Its value may change with the voltage applied. This may be because not all the current flows through the quenching resistor (the gap or separation region 412 between the contact region 480 and the active region 406). A small portion of the current may flow directly from the cathode (n+ substrate 474) to the anode (p+ contact region 480) without passing through the multiplication region 542, the charge layer (p− region) 442, the absorption region 532, the active region 406 and the gap 412. The current distribution within the LR-SiPM device 450 may change with the voltage applied. Therefore, a non-linear I-V curve 604 may be observed.

The internal quantum efficiency of the SiPM device 400 and the LR-SiPM device 450 may also be investigated by simulation. The devices may be illuminated by a collimated light beam with a certain wavelength and a power density of about 1 mW/cm². The incident light may be vertically launched (e.g. vertical incident beam) to the device surface. The dimension of the beam may be set to be the same as the detection window 404.

Figure 7:
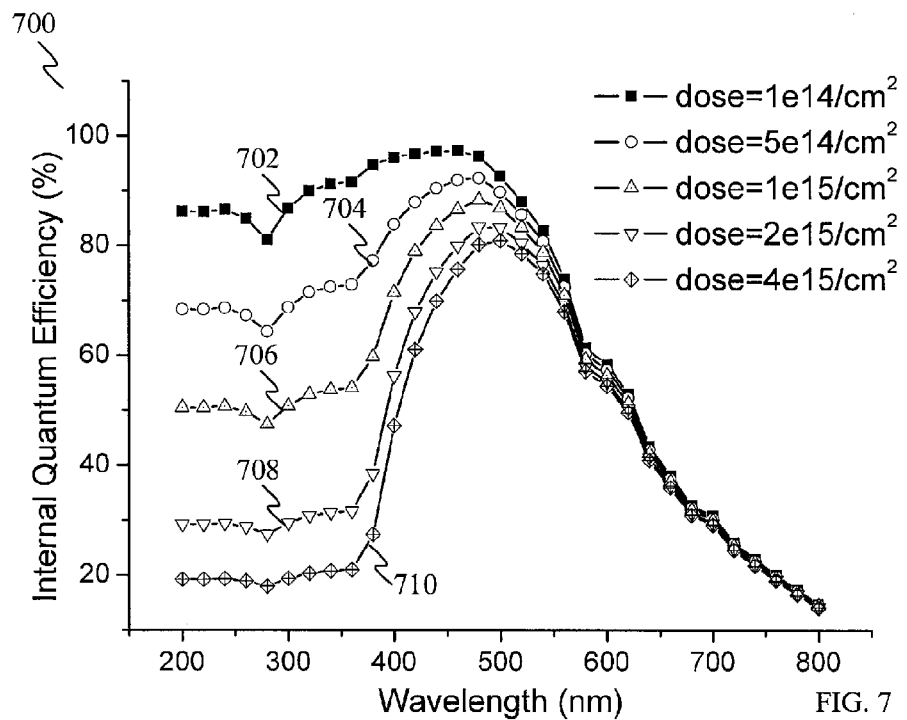
FIG. 7 shows a plot of simulation results for the internal quantum efficiency for the silicon photomultiplier with lateral bulk-Si quenching resistors (LR-SiPM) device of FIG. 4B, with different dosages applied to define the active p+ region.

The internal quantum efficiency of a series of LR-SiPMs, with doping dosages which are different from each other, may be calculated and determined as a function of wavelength. FIG. 7 shows a plot 700 of simulation results for the internal quantum efficiency for the LR-SiPM device 450 of FIG. 4B, with different dosages applied to define the active p+ region 406. The plot 700 shows the simulation result 702 corresponding to a doping dosage of $1 \times 10^{14}/cm^2$, the simulation result 704 corresponding to a doping dosage of $5 \times 10^{14}/cm^2$, the simulation result 706 corresponding to a doping dosage of $1 \times 10^{15}/cm^2$, the simulation result 708 corresponding to a doping dosage of $2 \times 10^{15}/cm^2$, and the simulation result 710 corresponding to a doping dosage of $4 \times 10^{15}/cm^2$. As may be clearly seen, the quantum efficiency of the LR-SiPM device 450 at short wavelengths increases noticeably with a decrease of the doping dosage of the active region 406. This result may confirm the correlation between the doping concentration and the carrier recombination. The quantum efficiency decreases at longer wavelengths (longer than 500 nm), as shown in FIG. 7. This decrease may be mainly attributed to the incomplete absorption of incident light within the 1.6 μm-thick epitaxial layer. In order to define the SACM structure, for example as shown in FIGS. 4A and 4B, two times of epitaxial growth of Si on the substrate and two times of doping processes may be required. The doping processes define the p− region 442 and the p+ region (active region) 406, both of which are very shallow. The total thickness of the epitaxial layers (0.8 μm+0.8 μm as shown in FIGS. 4A and 4B) may be approximately regarded as the thickness sum of the multiplication region 542 and the absorption region 532.

The current-voltage (I-V) curves of the SiPM device 400 and the LR-SiPM device 450 under illumination may also be calculated. Their responses under blue light (wavelength of about 440 nm; power density of about 1 mW/cm²) are shown in FIG. 8, together with the corresponding dark current curves of the respective SiPMs.

Figure 8:
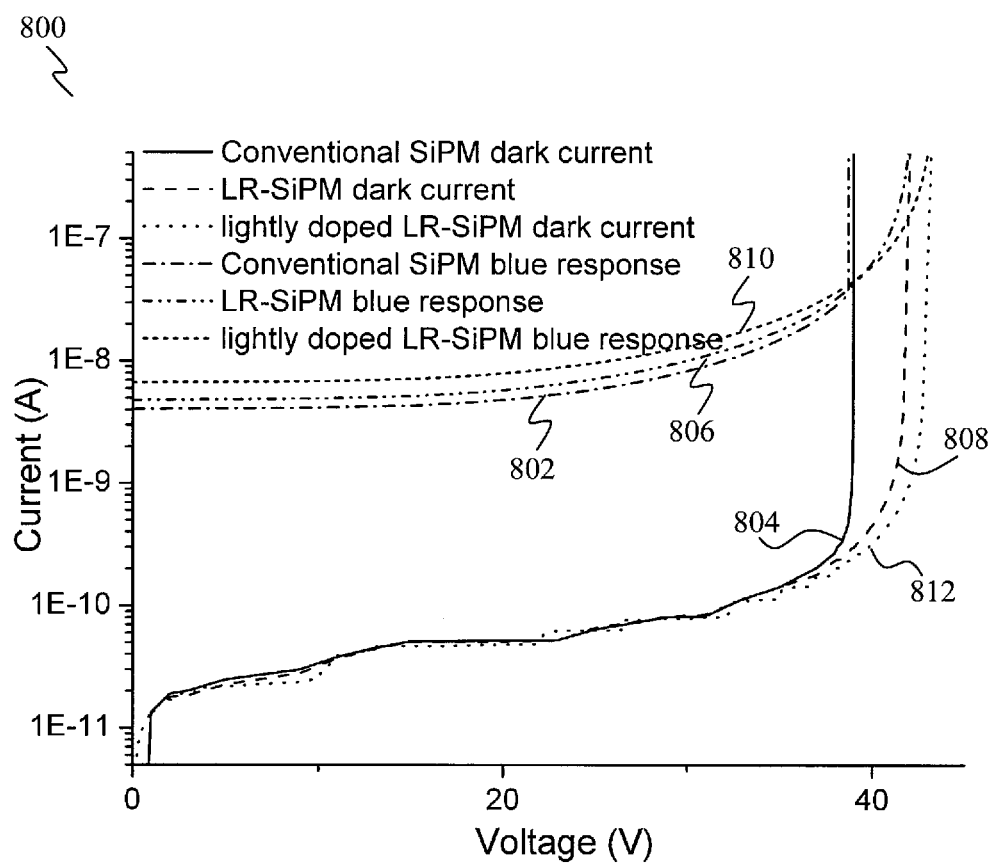
FIG. 8 shows a plot of simulation results for the blue light responses for the silicon photomultiplier (SiPM) device and the silicon photomultiplier with lateral bulk-Si quenching resistors (LR-SiPM) device of FIGS. 4A and 4B.

FIG. 8 shows a plot 800 showing the simulated blue light response 802 corresponding to the SiPM device 400, the simulated dark current curve 804 corresponding to the SiPM device 400, the simulated blue light response 806 corresponding to the LR-SiPM device 450, the simulated dark current curve 808 corresponding to the LR-SiPM device 450, the simulated blue light response 810 corresponding to the LR-SiPM device 450 which is lightly doped, and the simulated dark current curve 812 corresponding to the LR-SiPM device 450 which is lightly doped.

It should be appreciated that the LR-SiPM device 450 and the LR-SiPM device 450 which is lightly doped have the same device structure. For obtaining the simulated blue light response 806 and the simulated dark current curve 808, the doping dosage of the active region 406 of the LR-SiPM device 450 is approximately $4 \times 10^{15}/cm^2$, which is at least substantially the same as that for the active region 406 of the SiPM device 400. For obtaining the simulated blue light response 810 and the simulated dark current curve 812, the doping dosage of the active region 406 of the LR-SiPM device 450 is decreased to approximately $1 \times 10^{14}/cm^2$.

As may be seen, the dark current (curve 808) of the LR-SiPM 450 is almost the same as that of the SiPM device 400. However, a larger response to blue light may be observed in the LR-SiPM 450. A detailed analysis shows that the ratio between the responses in the LR-SiPM 450 and the SiPM device 400 may be almost identical to the ratio between the areas of the detection windows 404 in these two devices, which further confirms the close connection between the detection sensitivity and the fill factor of the device.

Figure 9:
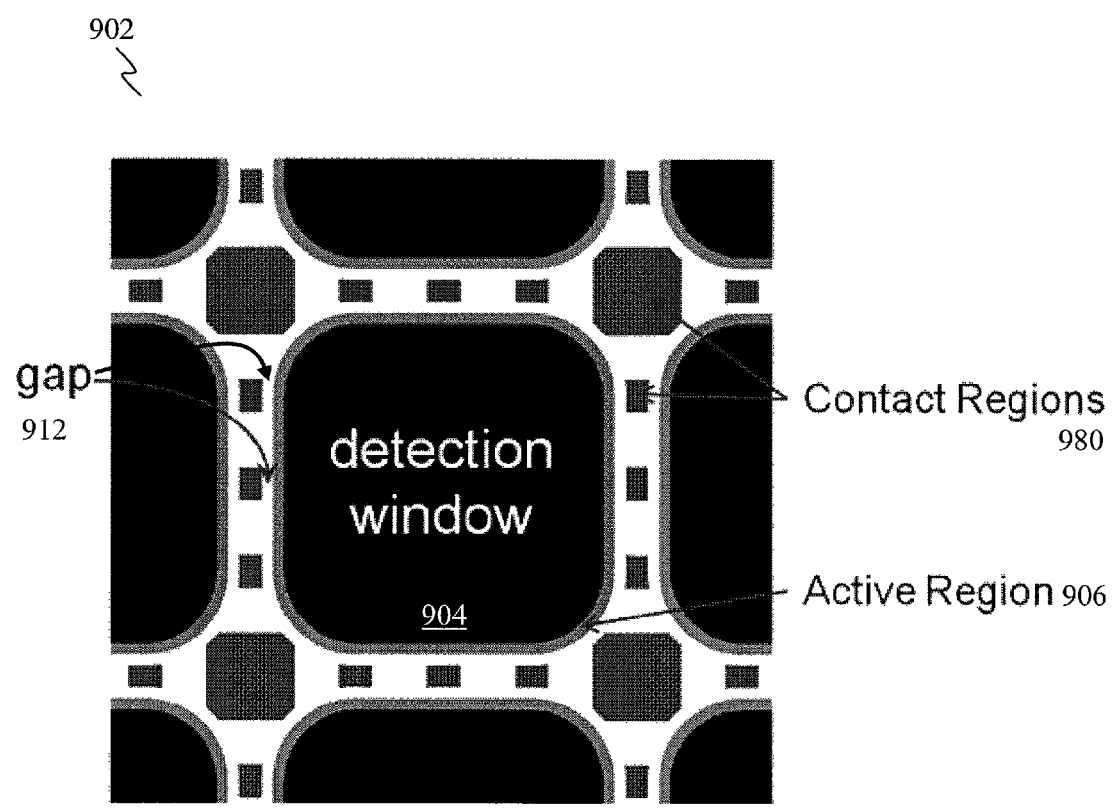
FIG. 9 shows a LR-SiPM cell with discontinuous contact regions, according to various embodiments.

As shown in FIG. 6, the I-V curve slope (curve 604) of the LR-SiPM 450 after breakdown is roughly identical to that of the SiPM 400 with a 2000 Ω serial resistor. In various applications of SiPM devices, however, quenching resistors with higher resistances, in the order of $10^5$ Ω or even higher, may be required. This high resistance may be achieved in the LR-SiPM 450 by increasing the width of the gap or separation region 412, between the contact region 480 and the active region 406, or by adoption of discontinuous contact regions, as shown in FIG. 9. In addition, the resistance may also be tuned by tuning the doping profile of the LR-SiPM device 450.

FIG. 9 shows a quenching LR-SiPM cell 902, according to various embodiments. The LR-SiPM cell 902 includes a detection window 904, an active region 906 and discontinuous contact regions 980, defined by a plurality of portions as shown in FIG. 9, at least substantially surrounding the active region 906. The discontinuous contact regions 980 are spaced apart from the active region 906 by a gap or separation region 912 defining a bulk quenching resistor. For clarity purposes for illustrating the discontinuous contact regions 980, metal wires are not shown in FIG. 9 for the LR-SiPM cell 902. Having discontinuous contact regions 980 may provide a high resistance, or at least higher than the resistance provided by a contact region which is at least substantially continuous, as the whole resistor may be regarded as the shunt connection of a plurality of independent bulk-Si resistors, defined by the respective gaps 912. Therefore, as the discontinuous contact regions 980 may provide a relatively higher resistance, such a structure may be employed in SiPM applications as high resistance for effective quenching may be required in SiPM applications.

As the bulk-Si resistors, defined by the respective gaps 912, may at least substantially surround the active region 906, and thus may have a ring-like structure or pattern, the LR-SiPM cell 902 may be termed as "Quenching Ring SiPM cell" or "QR SiPM cell", and may form part of a QR-SiPM device.

As described above, a silicon photomultiplier (SiPM) device with a high photon detection efficiency may be provided. For the structure of the SiPM device of various embodiments, the quenching resistor of the device may be achieved within the substrate (e.g. Si) bulk, and may be connected with the diode inherently. Thus, no metal wire connection may be needed in the active region, and therefore a high fill factor may be achieved. Furthermore, because of the separation of the active region and the anode contact region, the concentration of dopants in the active region may be reduced, which results in a greatly improved quantum efficiency at short wavelengths, especially for blue and ultraviolet light. The performance of the SiPM device of various embodiments, as determined by numerical simulation, shows an improvement over conventional SiPM devices. Compared with SiPMs with conventional configurations, the SiPM device structure of various embodiments has the advantages of higher detection efficiency, more flexible device design and simpler fabrication processes.

It should be appreciated that the photomultiplier device of various embodiments may be a solid-state photomultiplier (SSPM). While the photomultiplier device of various embodiments has been described in terms of a semiconductor photomultiplier device, it should be appreciated that a solid-state photomultiplier (SSPM) may be provided, having similar or the same features as described in the context of the semiconductor photomultiplier device of various embodiments.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A semiconductor photomultiplier device comprising:
   a substrate having a front side and a back side;
   a common electrode of a first conductivity type adjacent to the back side;
   a cell comprising an active region of a second conductivity type adjacent to the front side; and
   a contact region of the second conductivity type adjacent to the front side, the contact region being spaced apart from the active region by a separation region,
   wherein the separation region defines a resistor between the active region and the contact region to allow a current to flow between the active region and the contact region through the separation region.

2. The semiconductor photomultiplier device of claim 1, wherein the contact region at least substantially surrounds the active region.

3. The semiconductor photomultiplier device of claim 2, wherein the contact region is discontinuous, the contact region being defined by a plurality of portions arranged spaced apart from each other.

4. The semiconductor photomultiplier device of claim 1, wherein the separation region is between about 0.1 μm and about 2 μm.

5. The semiconductor photomultiplier device of claim 1, wherein the resistor defined by the separation region has a resistance that is higher than respective resistances of the active region and the contact region.

6. The semiconductor photomultiplier device of claim 1, wherein the active region is formed in a first portion of the substrate, and wherein the contact region is formed in a second portion of the substrate, the first portion being spaced apart from the second portion by the separation region.

7. The semiconductor photomultiplier device of claim 1, further comprising an electrical interconnection electrically coupled to the contact region.

8. The semiconductor photomultiplier device of claim 1, wherein the area of the front side to which the active region is adjacent and overlaps with is free of electrical interconnections.

9. The semiconductor photomultiplier device of claim 1, wherein the contact region comprises dopants of the second conductivity type at a concentration higher than dopants of the second conductivity type in the active region.

10. The semiconductor photomultiplier device of claim 1, wherein the cell further comprises an intermediate region of the first conductivity type between the active region and the common electrode.

11. The semiconductor photomultiplier device of claim 10, wherein the intermediate region at least substantially contacts the active region.

12. The semiconductor photomultiplier device of claim 10, wherein the intermediate region comprises dopants of the first conductivity type at a concentration lower than dopants of the first conductivity type in the common electrode.

13. The semiconductor photomultiplier device of claim 1, wherein the cell further comprises an intermediate region of the second conductivity type between the active region and the common electrode.

14. The semiconductor photomultiplier device of claim 13, wherein the intermediate region is spaced apart from the active region.

15. The semiconductor photomultiplier device of claim 13, wherein the intermediate region comprises dopants of the second conductivity type at a concentration equal to or lower than dopants of the second conductivity type in the active region.

16. The semiconductor photomultiplier device of claim 1, comprising a plurality of cells, each cell comprising a respective active region of the second conductivity type adjacent to the front side.

17. The semiconductor photomultiplier device of claim 1, wherein the first conductivity type is n-type conductivity type and the second conductivity type is p-type conductivity type.

18. The semiconductor photomultiplier device of claim 1, wherein the first conductivity type is p-type conductivity type and the second conductivity type is n-type conductivity type.

19. The semiconductor photomultiplier device of claim 1, wherein the surface of the front side is free of integrated resistors.

20. A semiconductor photomultiplier device comprising:
a substrate having a front side and a back side;
a common electrode of a first conductivity type adjacent to the back side;
a cell comprising an active region of a second conductivity type adjacent to the front side; and
a contact region of the second conductivity type adjacent to the front side, the contact region being spaced apart from the active region by a separation region,
wherein the separation region has a resistance that is higher than respective resistances of the active region and the contact region.

21. A semiconductor photomultiplier device comprising:
a substrate having a front side and a back side;
a common electrode of a first conductivity type adjacent to the back side;
a cell comprising an active region of a second conductivity type adjacent to the front side; and an intermediate region of the second conductivity type between the active region and the common electrode; and
a contact region of the second conductivity type adjacent to the front side, the contact region being spaced apart from the active region by a separation region.

* * * * *